(12) United States Patent
Li

(10) Patent No.: US 11,139,826 B2
(45) Date of Patent: Oct. 5, 2021

(54) DAC ERROR MEASUREMENT METHOD AND APPARATUS

(71) Applicant: Huawei Technologies Co., Ltd., Shenzhen (CN)

(72) Inventor: Haixi Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/938,516

(22) Filed: Jul. 24, 2020

(65) Prior Publication Data

US 2020/0366312 A1 Nov. 19, 2020

Related U.S. Application Data

(63) Continuation of application No. PCT/CN2018/110290, filed on Oct. 15, 2018.

(30) Foreign Application Priority Data

Jan. 26, 2018 (CN) .......................... 201810079570.2

(51) Int. Cl.
*H03M 3/00* (2006.01)

(52) U.S. Cl.
CPC ............. *H03M 3/38* (2013.01); *H03M 3/378* (2013.01); *H03M 3/422* (2013.01); *H03M 3/464* (2013.01)

(58) Field of Classification Search
CPC ........ H03M 3/38; H03M 3/378; H03M 3/422; H03M 3/464; H03M 3/394; H03M 1/742
See application file for complete search history.

(56) References Cited

U.S. PATENT DOCUMENTS

| 7,525,465 B1 * | 4/2009 | Elwan ................... H03M 3/364 341/120 |
| 8,803,715 B2 | 8/2014 | Lai et al. |

(Continued)

FOREIGN PATENT DOCUMENTS

| CN | 1977458 A | 6/2007 |
| CN | 104980154 A | 10/2015 |

(Continued)

OTHER PUBLICATIONS

Ho, S., et al., "A 23 mW,7 3dB Dynamic Range, 80MHz BW Continuous-Time Delta-Sigma Modulator in 20 nm CMOS," IEEE Journal of Solid-State Circuits, vol. 50, No. 4, Apr. 2015, pp. 908-919.

(Continued)

*Primary Examiner* — Brian K Young
(74) *Attorney, Agent, or Firm* — Conley Rose, P.C.

(57) ABSTRACT

A DAC error measurement apparatus includes: an ADC and a feedback DAC, where a measurement input of the ADC includes a square wave signal with a constant frequency, a direct-current signal at a constant logical level, and an analog output of the feedback DAC; a measurement selection module, configured to provide a measured digit in a digital output to a separately selected source cell, and provide remaining digits in the digital output to remaining source cells, where the measured digit is a flippable digit, and the remaining digits are non-flipping digits; and a measurement module, configured to measure an amplitude of the digital output based on the digital output. One flipping digit in the digital output is the measured digit, and the remaining digits are the non-flipping digits, such that the measurement selection module may separately select one source cell to receive the measured digit.

20 Claims, 19 Drawing Sheets

(56) References Cited

U.S. PATENT DOCUMENTS

| | | |
|---|---|---|
| 9,203,426 B2 | 12/2015 | Zhao et al. |
| 9,260,228 B2 | 2/2016 | Buck |
| 9,577,657 B1 | 2/2017 | Clara |
| 10,727,853 B1 * | 7/2020 | Zhao .................. H03M 1/1071 |
| 10,840,929 B1 * | 11/2020 | Weil .................. H03M 1/1009 |
| 10,855,301 B2 * | 12/2020 | Zhou .................. H03M 1/1023 |
| 2005/0285763 A1 | 12/2005 | Nguyen et al. |
| 2010/0073207 A1 | 3/2010 | Gupta et al. |
| 2015/0002325 A1 | 1/2015 | Lin |
| 2016/0211861 A1 | 7/2016 | Op 'T Eynde et al. |
| 2017/0170839 A1 | 6/2017 | Zhao et al. |
| 2017/0170840 A1 | 6/2017 | Zhao |

FOREIGN PATENT DOCUMENTS

| | | |
|---|---|---|
| CN | 105811977 A | 7/2016 |
| CN | 106888020 A | 6/2017 |
| CN | 107342769 A | 11/2017 |
| EP | 2930849 A1 | 10/2015 |
| EP | 3182595 A1 | 6/2017 |

OTHER PUBLICATIONS

Krishnapura, N., "Efficient Determination of Feedback DAC Errors for Digital Correction in AD converters," Proceedings of 2010 IEEE International Symposium on Circuits and Systems, Aug. 3, 2010, 4 pages.

* cited by examiner

DAC ERROR MEASUREMENT METHOD AND APPARATUS

CROSS-REFERENCE TO RELATED APPLICATIONS

This application is a continuation of International Patent Application No. PCT/CN2018/110290, filed on Oct. 15, 2018, which claims priority to Chinese Patent Application No. 201810079570.2, filed on Jan. 26, 2018. The disclosures of the aforementioned applications are hereby incorporated by reference in their entireties.

TECHNICAL FIELD

This application relates to the field of mobile communications technologies, and in particular, to a DAC error measurement method and apparatus.

BACKGROUND

An analog-to-digital converter (ADC) based on a delta-sigma modulator (DSM) structure is widely applied in the communications and audio fields, and is an optimal alternative solution for a high-precision ADC.

A DSM includes a loop filter (LF), a quantizer (Q), and a feedback digital-to-analog converter (DAC). A signal-to-quantization-noise ratio (SQNR) is determined based on an order quantity of the loop filter and a bit quantity of the quantizer. A higher order quantity and a higher bit quantity indicate a higher SQNR, better DSM performance, but higher circuit complexity. To balance the DSM performance and the circuit complexity, the order quantity of the loop filter is generally 3 or 4, and the bit quantity of the quantizer is 4.

Compared with a 1-bit quantizer, a 4-bit quantizer has a problem: Mismatch of a feedback DAC, especially a DAC in an outermost loop, will deteriorate linearity of a modulator. One of indicators for evaluating linearity is total harmonic distortion (THD) that reflects linear performance of an ADC. A DAC applied in the DSM generally uses a current steering structure, and mismatch of the DAC is mainly caused by mismatch between unit currents ("Icell") of current steering.

At present, in a high-speed DSM design, a DAC correction technology is generally used, and a mismatch problem of a DAC is resolved by designing a DAC error measurement circuit and a DAC error compensation circuit. In the DAC error measurement circuit, when a complex signal excitation source, such as a full-swing oscillation signal, is used, complexity of the DAC error measurement circuit is increased. When a simple signal excitation source, such as a direct-current signal excitation source, is used, circuit complexity can be reduced. However, measurement parameters measured each time are different. For example, different comparators are used to measure different current units, resulting in unsatisfactory measurement accuracy. In conclusion, an existing DAC error measurement circuit has a technical problem of unsatisfactory measurement accuracy.

SUMMARY

This application provides a DAC error measurement method and apparatus, to improve DAC error measurement accuracy.

The DAC error measurement apparatus provided in this application is used for measurement of a matching error of a feedback DAC, and may be applied to a continuous-time DSM and a discrete-time DSM, a differential DSM and a single-ended DSM, or another circuit system including a DAC, such as a Pipeling-ADC or a pure DAC circuit. In all the foregoing cases, the DAC error measurement method and apparatus described in this application can be used.

According to a first aspect, to achieve the foregoing disclosure objective, the DAC error measurement apparatus provided in this application includes: an ADC and a measurement selection module. The ADC is configured to digitize a measurement input of the ADC to generate a digital output and use the digital output as an input of the measurement selection module, where the ADC includes a feedback DAC, and the measurement input includes a square wave signal with a constant frequency, a direct-current signal at a constant logical level, and an analog output of the feedback DAC. The measurement selection module is configured to: provide an input to the feedback DAC based on the digital output, where the measurement selection module is configured to determine a separately selected source cell; provide a measured digit in the digital output to the separately selected source cell; and provide remaining digits in the digital output to remaining source cells, where the measured digit is a flippable digit, and the remaining digits are non-flipping digits. The feedback DAC is configured to provide the analog output to the ADC based on the input provided by the measurement selection module, and the measurement module is configured to measure an amplitude of the digital output based on the digital output. According to the foregoing DAC error measurement apparatus, one flipping digit in the digital output is the measured digit, and the remaining digits are the non-flipping digits. Based on this, a measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

In a possible design, the ADC includes a loop filter and a quantizer, and an output of the loop filter is coupled to an input of the quantizer. The loop filter provides a low-gain input to the quantizer, and the quantizer converts the low-gain input into P digits and uses the P digits as the digital output, where only one of the P digits is a flipping digit, the flipping digit flips between 0 and 1, and the flipping digit is used as the measured digit. The loop filter is configured to provide the low-gain input to the quantizer, such that one flipping digit in the digital output that is output by the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when a matching error of the separately selected source cell is measured.

In a possible design, the DAC error measurement apparatus provided in this application further includes a control module. The control module is configured to provide a switching enable signal to the ADC, where the switching enable signal is used to control the loop filter to provide the low-gain input to the quantizer. The ADC is further configured to switch a power-on order quantity and/or an element coefficient of the loop filter based on the switching enable signal provided by the control module, such that the loop filter provides the low-gain input to the quantizer. Based on re-configurability of the loop filter, when the loop filter is in a mode 2 due to adjustment of the power-on order quantity or the element coefficient, the input low loop gain provided to the quantizer can implement that one flipping digit in the digital output of the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

In a possible design, a bit quantity of the quantizer is n, the digital output is a thermometer code, and the P digits include $2^n$ digits. Alternatively, the digital output is a binary code, and the P digits include n digits. The DAC error measurement apparatus provided in this application is not only applicable to signal conversion based on a thermometer code, but also applicable to signal conversion based on a binary code.

In a possible design, the feedback DAC includes P source cells. The control module is configured to provide a measurement selection signal to the measurement selection module, where the measurement selection signal indicates the separately selected source cell. The measurement selection module is configured to perform, based on the measurement selection signal, overall dislocation adjustment on a conducted electric connection relationship between the P digits and the P source cells, to provide the measured digit to the separately selected source cell, and provide, based on a conducted electric connection relationship obtained after dislocation, remaining P-1 digits to P-1 source cells other than the separately selected source cell. The control module sends a measurement selection signal (for example, SEL=1, . . . , and SEL=P) to the measurement selection module, to control the measurement selection module to separately select one source cell from the P source cells to receive the measured digit each time the measurement selection signal is received, until each source unit is selected once. Compared with other approaches, this method for selecting a to-be-measured source cell can simplify circuit design and is easy to implement.

In a possible design, the control module is configured to successively provide P measurement selection signals to the measurement selection module, where separately selected source cells indicated by the P measurement selection signals are different from each other. The measurement selection module is configured to: receive the P measurement selection signals successively provided by the control module; and perform overall dislocation adjustment on the conducted electric connection relationship between the P digits and the P source cells once each time one of the measurement selection signals is received, until the P source cells are all measured. In P measurement processes, the control module successively provides P measurement selection signals to the measurement selection module, and the separately selected source cells indicated by the P measurement selection signals are different from each other, such that the measurement selection module performs overall dislocation adjustment on the conducted electric connection relationship between the P digits and the P source cells once each time one of the measurement selection signals is received, until the P source cells are separately selected to receive the measured digit.

In a possible design, the DAC error measurement apparatus provided in this application further includes a digital filter circuit, where an output of the quantizer is coupled to an input of the digital filter circuit, and where an output of the digital filter circuit is coupled to an input of the measurement circuit. The digital filter circuit is configured to filter out a high-frequency part from the digital output, and provide, to the measurement module, a digital output from which the high-frequency part is filtered out. The measurement module is configured to measure an amplitude of the digital output from which the high-frequency part is filtered out. After the digital filter circuit filters out a high-frequency signal from the digital output, impact of an interference signal on error measurement can be eliminated, thereby helping improve error measurement accuracy.

In a possible design, the DAC error measurement apparatus provided in this application further includes an error calculation module, where the error calculation module is connected to the measurement module. The error calculation module is configured to: obtain, from the measurement module, the amplitudes measured by the measurement module when the P source cells are measured; determine an average amplitude value of the P source cells based on the obtained amplitudes; and determine a matching error of each of the P source cells based on the average amplitude value. Based on the foregoing embodiment, an error calculation algorithm is simplified. The digital output of the P source cells may be obtained using the algorithm. This helps accurately measure the matching error of each source cell.

In a possible design, the DAC error measurement apparatus provided in this application further includes a first signal source and a second signal source, where the first signal source and the second signal source are obtained by reusing a circuit structure of the source cell, the first signal source provides the square wave signal within measurement duration of the P source cells, and the second signal source provides the direct-current signal within the measurement duration of the P source cells. Reusing of a circuit structure of a current source cell can reduce circuit costs of a bias signal source (a signal source that provides the direct-current signal) and an excitation signal source (a signal source that provides the square wave signal), and the bias signal source and the excitation signal source better match a source cell of the feedback DAC. This helps avoid introducing a matching error between the excitation signal source and the bias signal source to an error measurement result.

In a possible design, the control module is configured to: before all the P source cells are measured, ground an analog input of the ADC; power on the error calculation module, the measurement module, the first signal source, and the second signal source; and switch the DAC measurement apparatus from a signal processing mode (a mode 1) to an error measurement mode (a mode 2).

In a possible design, the control module is configured to: after all the P source cells are measured, provide a switching enable signal to the measurement selection module, where the switching enable signal is used to switch a power-on order quantity in m orders and/or switch an element coefficient of the m orders, such that the loop filter provides a high-gain input to the quantizer; and switch the loop filter of the DAC measurement apparatus from an error measurement mode (a mode 2) to a signal processing mode (a mode 1).

In a possible design, the control module is further configured to: ground the first signal source, the second signal source, and the measurement module after all the P source cells are measured; and switch the loop filter of the DAC measurement apparatus from an error measurement mode (a mode 2) to a signal processing mode (a mode 1).

In a possible design, the measurement module is a discrete Fourier transform circuit with a constant frequency. The discrete Fourier transform circuit with the constant frequency may perform digital fixed-point measurement, to measure a digital amplitude of one digit in digits into which an analog output of a source cell selected to be measured is converted. This helps simplify an error calculation algorithm.

According to a second aspect, this application provides a DAC error measurement method, applied to the DAC error measurement apparatus according to the first aspect. The method includes: generating, by an ADC, a digital output based on a measurement input, and providing the digital output to a measurement selection module and a measurement module, where the measurement input includes a square wave signal with a constant frequency, a direct-current signal at a constant logical level, and an analog output of a feedback DAC of the ADC; providing, by the measurement selection module, an input to the feedback DAC based on the digital output, where a separately selected source cell is determined, a measured digit in the digital output is provided to the separately selected source cell, and remaining digits in the digital output are provided to remaining source cells, where the measured digit is a flippable digit, and the remaining digits are non-flipping digits; providing, by the feedback DAC, the analog output to the ADC based on the input provided by the measurement selection module; and measuring, by the measurement module, an amplitude of the digital output based on the digital output. According to the foregoing DAC error measurement method, one flipping digit in the digital output of the quantizer is the measured digit, and the remaining digits are the non-flipping digits. Based on this, a measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

In a possible design, the ADC includes an m-order loop filter and an n-bit quantizer, and an output of the loop filter is coupled to an input of the quantizer. Based on this, the generating, by an ADC, a digital output based on a measurement input includes: providing, by the loop filter, a low-gain input to the quantizer; and converting, by the quantizer, the low-gain input into P digits and using the P digits as the digital output, where only one of the P digits is a flipping digit, and the flipping digit flips between 0 and 1, and the flipping digit is used as the measured digit. The loop filter is made to provide the low-gain input to the quantizer, such that one flipping digit in the digital output that is output by the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when the matching error of the separately selected source cell is measured.

In a possible design, the generating, by an ADC, a digital output based on a measurement input includes: receiving, by the ADC, a switching enable signal sent by a control module; and switching a power-on order quantity and/or an element coefficient of the loop filter based on the switching enable signal, such that the loop filter provides the low-gain input to the quantizer, and the quantizer converts the low-gain input into P digits and uses the P digits as the digital output. Based on the switching enable signal sent by the control module, the loop filter may be switched to an error measurement mode (a mode 2) by adjusting the power-on order quantity or the element coefficient of the loop filter, such that the input low loop gain that may be provided to the quantizer can implement that one flipping digit in the digital output of the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

In a possible design, the feedback DAC includes P source cells. Based on this, the providing, by the measurement selection module, an input to the feedback DAC based on the digital output includes: receiving, by the measurement selection module, a measurement selection signal sent by the control module, where the measurement selection signal indicates the separately selected source cell; and performing, by the measurement selection module based on the measurement selection signal, overall dislocation adjustment on a conducted electric connection relationship between the P digits and the P source cells, to provide the measured digit to the separately selected source cell, and provide, based on a coupling relationship obtained after dislocation, remaining P−1 digits to P−1 source cells other than the separately selected source cell. The measurement selection module may separately select, by receiving a measurement selection signal (for example, SEL=1, . . . , and SEL=P) sent by the control module, one source cell from the P source cells to receive the measured digit each time the measurement selection signal is received, until each source unit is selected once. Compared with other approaches, this method for selecting a to-be-measured source cell can simplify circuit design and is easy to implement.

In a possible design, the providing, by the measurement selection module, an input to the feedback DAC based on the digital output includes: successively receiving, by the measurement selection module, P measurement selection signals provided by the control module, where separately selected source cells successively indicated by the P measurement selection signals are different from each other; and performing overall dislocation adjustment on the conducted electric connection relationship between the P digits and the P source cells once each time the measurement selection module receives one of the measurement selection signals, until the P source cells are selected in turn to receive the measured digit. In P measurement processes, the control module successively provides P measurement selection signals to the measurement selection module, and the separately selected source cells indicated by the P measurement selection signals are different from each other. As such, the measurement selection module performs overall dislocation adjustment on the conducted electric connection relationship between the P digits and the P source cells once each time one of the measurement selection signals is received, until the P source cells are separately selected to receive the measured digit.

In a possible design, the measuring, by the measurement module, an amplitude of the digital output based on the digital output includes receiving, by the measurement circuit, a digital output from which a high-frequency part is filtered out, and measuring an amplitude of the digital output from which the high-frequency part is filtered out, where an output of the quantizer is coupled to an input of the digital filter circuit, an output of the digital filter circuit is coupled to an input of the measurement circuit, and the digital filter circuit provides, to the measurement circuit, the digital output from which the high-frequency part is filtered out. After the digital filter circuit filters out a high-frequency signal from the digital output, impact of an interference signal on error measurement can be eliminated, thereby helping improve error measurement accuracy.

In a possible design, the method further includes: obtaining, by an error calculation module from the measurement module, the amplitudes measured by the measurement module when the P source cells are measured; determining, by the error calculation module, an average amplitude value of the P source cells based on the obtained amplitudes; and determining, by the error calculation module, a matching error of each of the P source cells based on the average amplitude value.

According to a third aspect, this application provides an apparatus configured to perform an action performed by the control module in the foregoing embodiments. The apparatus may be disposed in the DAC error measurement apparatus according to the first aspect, or may be disposed outside the DAC error measurement apparatus according to the first aspect.

The apparatus includes at least one processor, a communications bus, a memory, and at least one communications interface. The memory is configured to store related application program code for executing the solutions of this application, and the application program code is executed under control of the processor. The processor is configured to execute the application program code stored in the memory. The processor herein may be one or more devices, circuits, and/or processing cores for processing data (for example, a computer program instruction). In an optional embodiment, the processor may include one or more central processing units (CPUs).

In a possible design, the processor is configured to send a switching enable signal to the loop filter according to the first aspect or the second aspect, to switch a working mode of the loop filter from a mode 1 to a mode 2. The switching enable signal is used to switch a power-on order quantity and/or an element coefficient of the loop filter, and a function of the above is to make the loop filter provide a low-gain input to the quantizer in the mode 2, and the quantizer convert the low-gain input into P digits in the mode 2 and use the P digits as the digital output, to implement that only one of the P digits is a flipping digit, the flipping digit flips between 0 and 1, and the flipping digit is used as the measured digit.

In a possible design, the processor is further configured such that in a measurement process of the P source cells according to the first aspect or the second aspect, the processor sends a measurement selection signal to a measurement selection module, where the measurement selection signal indicates a separately selected source cell. A function of the above is to: after the measurement selection module according to the first aspect or the second aspect receives the measurement selection signal sent by the control module, perform, based on an indication of the measurement selection signal, overall dislocation adjustment on a conducted electric connection relationship between the P digits and the P source cells, to provide the measured digit to the separately selected source cell, and provide, based on a coupling relationship obtained after dislocation, remaining P−1 digits to P−1 source cells other than the separately selected source cell.

In a possible design, the processor is configured such that in the measurement process of the P source cells according to the first aspect or the second aspect, the processor successively sends P measurement selection signals to the measurement selection module, where separately selected source cells successively indicated by the P measurement selection signals are different from each other. A function of the above is to: make the measurement selection module successively receive the P measurement selection signals; and perform overall dislocation adjustment on the conducted electric connection relationship between the P digits and the P source cells once each time the measurement selection module receives one of the measurement selection signals, until the P source cells are all measured.

In a possible design, the processor may perform a calculation function performed by the error calculation module according to the first aspect or the second aspect.

For example, the processor is further configured to: obtain, from a measurement module, amplitudes measured by the measurement module when the P source cells are measured; determine an average amplitude value of the P source cells based on the obtained amplitudes; and determine a matching error of each of the P source cells based on the average amplitude value. The control module according to the first aspect or the second aspect can perform the calculation function performed by the error calculation module according to the first aspect or the second aspect. This helps simplify a circuit.

In a possible design, the processor is configured to switch a working mode of the DAC error measurement apparatus according to the first aspect from a mode 1 to a mode 2 before sending the switching enable signal to the loop filter.

For example, the processor is further configured to: power on the measurement module, the measurement selection module, a first signal source, and a second signal source before sending the switching enable signal to the loop filter, where the first signal source provides a square wave signal with a constant frequency to the loop filter, and the second signal source provides a direct-current signal at a constant logical level to the loop filter; and ground an analog input U of the ADC. A function of the above is to make a measurement input provided by an input end of the ADC include the square wave signal with the constant frequency provided by the first signal source, the direct-current signal at the constant logical level provided by the second signal source, and an analog output of a feedback DAC.

In a possible design, in this embodiment of this application, the control module according to the first aspect or the second aspect of this application or the apparatus according to the third aspect of this application may be divided into function modules based on the foregoing examples. For example, each function module may be obtained through division based on each corresponding function, or two or more functions may be integrated into one processing module. The integrated module may be implemented in a form of hardware, or may be implemented in a form of a software function module.

According to a fourth aspect, this application provides an apparatus including a processing unit and a transceiver unit, when each function module is obtained through division based on each function of the control module according to the first aspect or the second aspect or each function of the apparatus according to the third aspect. The transceiver unit is used by the processing unit to send and receive a signal.

In a simple embodiment, the processing unit may be implemented by a processor, and the transceiver unit may be implemented by a transceiver. For example, a method performed by the processing unit may be performed by the processor by invoking application program code stored in a memory. This is not limited in the embodiments of this application.

According to a fifth aspect, an embodiment of this application further provides a communications apparatus. The communications apparatus includes a processor and a memory. The memory stores a computer program. When the processor reads and executes a computer program stored in the memory, the communications apparatus is enabled to implement a method performed by the control module according to the first aspect or the second aspect of this application or the apparatus according to the third aspect of this application.

According to a sixth aspect, an embodiment of this application further provides a chip, where the chip is connected to a memory, the memory stores a computer program. The chip is configured to read and execute the computer program stored in the memory, to implement the control module according to the first aspect or the second aspect of this application, and a method performed by the apparatus according to the third aspect of this application.

According to a seventh aspect, an embodiment of this application further provides a computer storage medium storing program code. The stored program code is executed by a processor to implement the control module according to the first aspect or the second aspect of this application and a method performed by the apparatus according to the third aspect of this application.

According to an eighth aspect, an embodiment of this application further provides a computer program product. The computer program product includes a computer software instruction, and the computer software instruction may be loaded by a processor to implement the control module according to the first aspect or the second aspect of this application and a method performed by the apparatus according to the third aspect of this application.

DESCRIPTION OF EMBODIMENTS

The following describes in further detail this application with reference to the accompanying drawings.

Figure 1:
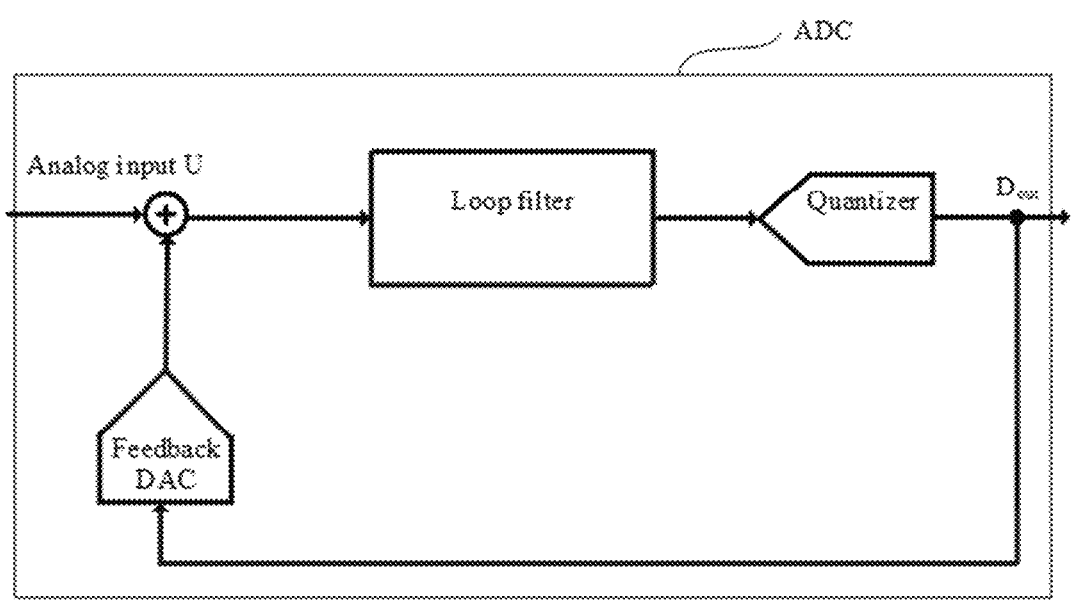
FIG. 1 is a schematic structural diagram of a DSM according to an embodiment of this application.

FIG. 1 shows an example of a circuit structure of an ADC with a DSM modulator structure to which this application is applicable. The DSM includes a loop filter, a quantizer, and a feedback digital-to-analog converter (DAC). An output of the loop filter is used as an input of the quantizer, an output of the quantizer is used as an input of the feedback DAC, and an output of the feedback DAC and an analog input signal are combined and then used as an input of the loop filter.

The ADC converts an analog input signal into a digital signal. For example, the ADC converts a continuous-time continuous-amplitude analog input signal into a discrete-time discrete-amplitude digital signal through sampling, quantization, and encoding. The loop filter samples the analog input signal, and outputs continuous analog signal amplitude values from the analog input signal. The quantizer quantizes the continuous analog signal amplitude values, to output approximately discrete amplitude values in a discrete period, and the analog input signal can be converted into the digital signal using two values 0 and 1 to represent discrete amplitudes. The digital signal Dout that is obtained through conversion by the ADC may be referred to as a digital output Dout. The digital output Dout includes a digital value sequence. The digital value sequence may be a thermometer code or a binary code. A bit quantity of the digital sequence value is referred to as resolution. A most significant bit is referred to as a Most Significant Bit (MSB), and a least significant bit is referred to as a Least Significant Bit (LSB). A minimum amplitude of a recognizable analog signal is 1 LSB.

In this application, the feedback DAC is a DAC in an ADC feedback path, in particular, an outermost feedback DAC 1. The input of the feedback DAC is a digital output of the ADC, and the output of the feedback DAC is fed back to an input of the ADC. In this application, the output of the feedback DAC is referred to as analog output, and after the analog output passes through the loop filter and the quantizer again, a quantization noise may be shaped to a high frequency, to meet signal conversion precision of the ADC.

The feedback DAC includes a source cell array including a plurality of source cells. For example, the feedback DAC uses a current steering structure, and the source cell is also referred to as a unit current or a current source cell (Icell), or the source cell not only includes a current source cell but also may include other peripheral components related to the current source cell. Each source cell can convert an imported digit into a current or voltage for output, and currents or voltages provided by the source cells are fed back as analog signals to an input end of the ADC. Although the quantization noise of the quantizer may be shaped through the feedback DAC, the ADC cannot correct an error introduced by the feedback DAC, and the error introduced by the feedback DAC is mainly reflected in linearity. This is because larger mismatch between internal components of the feedback DAC indicates more apparent nonlinearity. A matching error of the feedback DAC is mainly caused by mismatch between the source cells. A larger matching error indicates a smaller total harmonic distortion THD and poorer linear performance of the ADC.

To resolve a problem that the matching error introduced by the feedback DAC reduces signal conversion precision of the ADC, the matching error introduced by the feedback DAC needs to be measured and corrected. A feedback DAC error measurement apparatus in this application is obtained by adding another component on a basis of an original circuit structure of the ADC.

It should be noted that "a plurality of" in the descriptions of this application means two or more. In view of this, in the embodiments of the present disclosure, "a plurality of" may also be understood as "at least two". The term "and/or" describes an association relationship for describing associated objects and represents that three relationships may exist. For example, A and/or B may represent the following three cases: Only A exists, both A and B exist, and only B exists. In addition, the character "/", unless otherwise specified, usually indicates an "or" relationship between the associated objects. In addition, it should be understood that in descriptions of this application, terms such as "first" and "second" are merely used for differentiation and description, but should not be understood as an indication or implication of relative importance or an indication or implication of an order.

A matching error measurement circuit of the feedback DAC in other approaches has the following disadvantages: First, when a source cell receives a flipping digit, another source cell also receives a flipping digit. As a result, a matching error of a source cell may be introduced into a matching error measurement result of another source cell, and a measurement error is relatively large. Second, when different source cells are measured, analog outputs of all source cells are provided with direct-current signals with different amplitudes, such that time domain output waveforms of a digital output of the quantizer have different biases, and measurement results of all the source cells are obtained under different bias conditions. Therefore, different biases may introduce a measurement error. Measurement accuracy of an existing DAC error measurement circuit is not high due to these two reasons.

To improve measurement accuracy of a matching error of a measured source cell, it is expected that a matching error of a source cell is not introduced into an error measurement result of another source cell. If a status of only one of a plurality of digits (which may be set to P digits) output by the digital output Dout is different from statuses of other P−1 digits, for example, only one digit can flip between 0 and 1, and other P−1 digits are in a steady state and do not flip, when a source cell is measured, a digit received by the source cell is controlled to be a flippable digit, and a digit received by another source cell is controlled to be a non-flipping digit. In this way, a matching error of a source cell is not introduced into an error measurement result of another source cell.

Figure 5A:
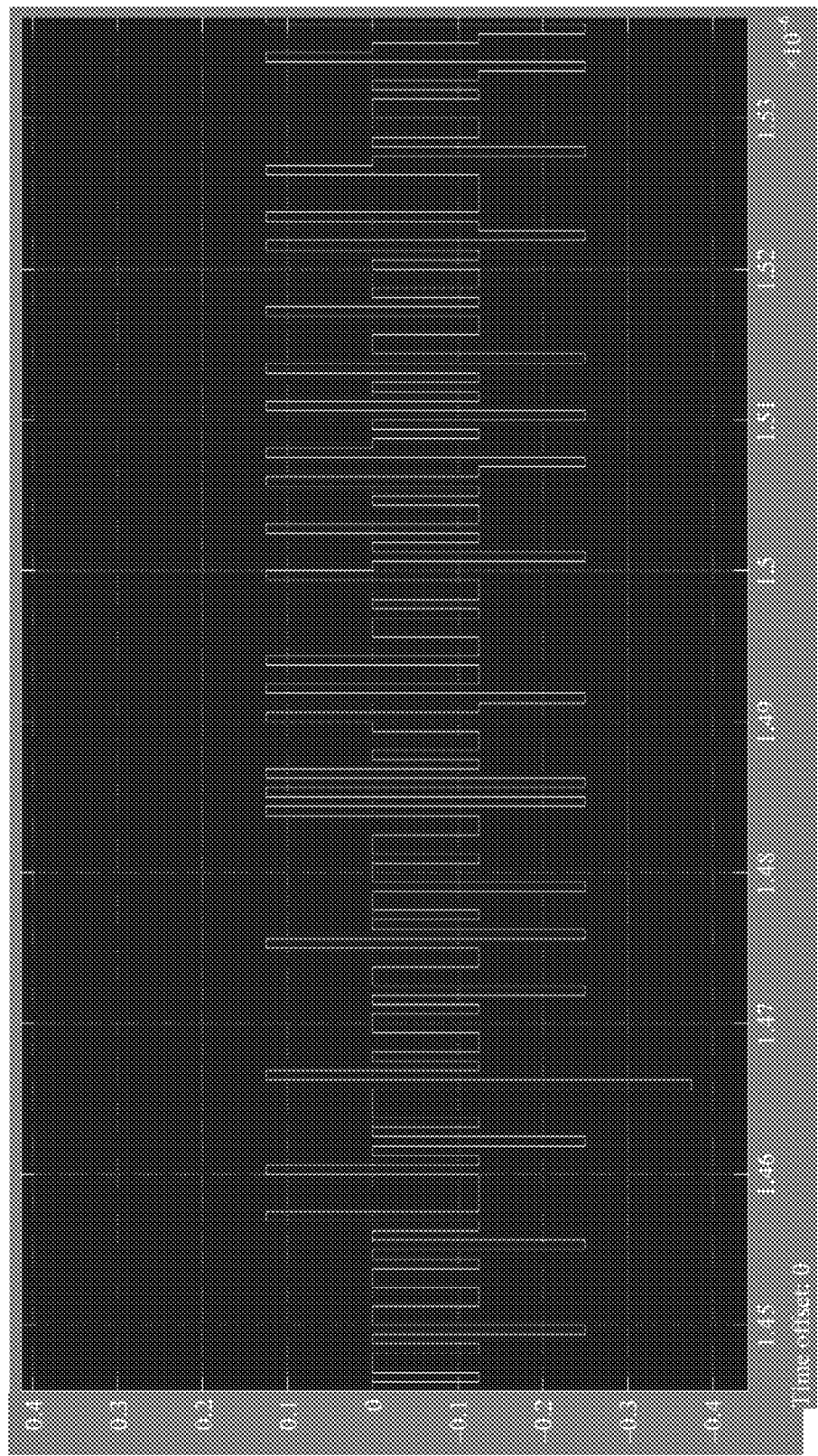
FIG. 5A is a schematic diagram of a $D_{out}$ time domain output waveform of a DAC error measurement apparatus in a mode 1 according to Embodiment 1 of this application.

A change status of digital values 0 and 1 in the P digits is related to a loop gain of the digital output Dout at an infinite distance. A larger loop gain value indicates a larger quantity of flipping code values of the quantizer, correspondingly, indicates more change statuses of the digital values 0 and 1 in the P digits, and indicates more chances for flipping in the P digits because a status change is caused by flipping between 0 and 1. As shown in FIG. 5A, when the loop gain makes the quantity of flipping code values of the quantizer be 4, at least four different statuses are switched back and forth. In this case, necessarily, at least two digits have a chance of flipping. If two digits flip, the two digits may be used as two measured digits, and the two measured digits are provided to two source cells. When one measured digit is provided to a measured source cell, the other measured digit is also provided to the other source cell, and a matching error of this source cell is introduced into an error measurement of the measured source cell.

To make a status of only one of the P digits different from statuses of other P−1 digits, in this application, the quantity of flipping code values of the quantizer is adjusted to 2 by changing an out-of-band gain of Dout. In this case, the digit values 0 and 1 in the P digits have two change statuses. Correspondingly, only one digit has a chance to change a status. A status change is caused by flipping between 0 and 1. To be more specific, only one digit flips, and the other digits do not flip. This may avoid, by providing the flipping digit to the measured source cell as a measured digit, introducing a matching error of a source cell into an error measurement result of the measured source cell, thereby improving measurement accuracy of a matching error when each source cell is measured.

To achieve the foregoing disclosure objective, a core point of this application is as follows: In implementation, in addition to using a square wave signal as a measurement input, a direct-current signal at a constant logical level is used as a measurement input, such that the out-of-band gain of Dout is biased. In addition, the loop filter is controlled to provide a low-gain input to the quantizer, such that a quantity of flipping code values of the out-of-band gain of Dout is reduced. In other words, a quantity of flipping code values of the quantizer is reduced.

Based on the foregoing concept, the following describes, with reference to various embodiments, implementation of improving measurement accuracy of a matching error of a measured source cell in this application.

Figure 2A:
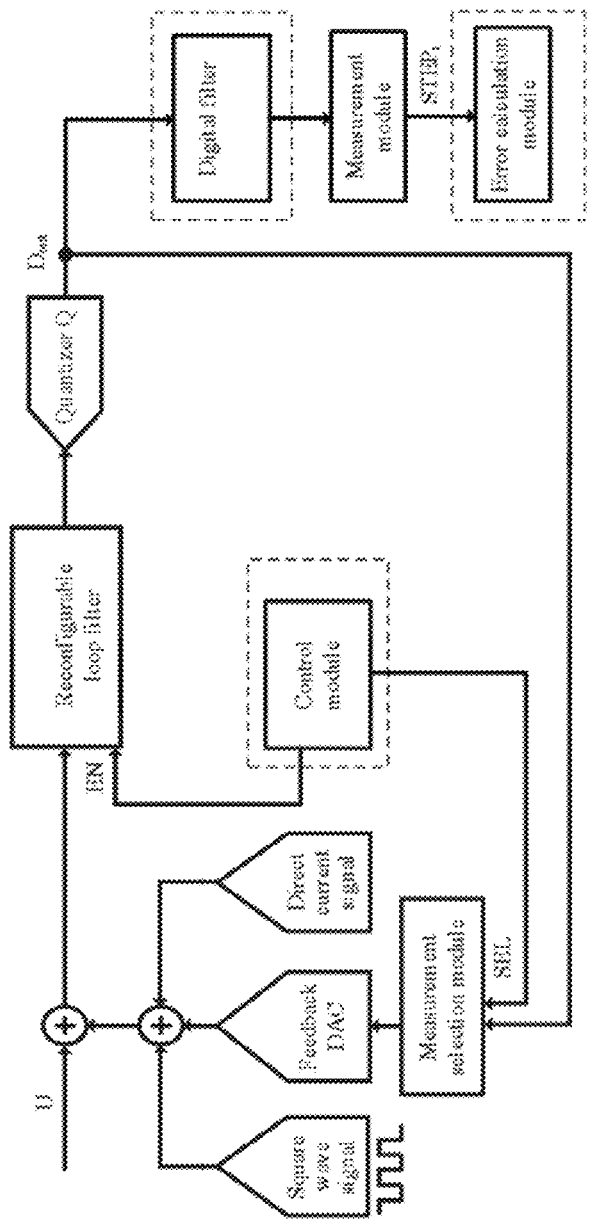
FIG. 2A is a schematic structural diagram of a DAC error measurement apparatus according to an embodiment of this application.

As shown in FIG. 2A, a DAC error measurement apparatus provided in this application may be applied to a DSM, and includes an ADC, a measurement module, and a measurement selection module. The ADC includes a loop filter, a quantizer, and a feedback DAC. A connection relationship between the loop filter, the quantizer, the measurement selection module, and the feedback DAC satisfies the following signal flow relationship: An output of the loop filter is used as an input of the quantizer, an output of the quantizer is used as an input of the measurement selection module, and an output of the measurement selection module is used as an input of the feedback DAC, and an output of the feedback DAC, a square wave signal, and a direct-current signal are together used as a measurement input of the loop filter. The output of the quantizer is also used as an input of the measurement module. The measurement module receives a digital output of the quantizer, and measures an amplitude of the digital output. Modules in dashed-line boxes in FIG. 2A are optional modules.

For a measurement input, the square wave signal is a square wave signal with a constant frequency, and the direct-current signal is a direct-current signal at a constant logical level.

Functions of the loop filter and the quantizer are to digitize a measurement input of the ADC, to generate a digital output Dout. The digital output Dout is used as an input of the measurement selection module.

The measurement selection module is configured to provide an input to the feedback DAC based on the digital output Dout of the quantizer. For example, the measurement selection module is configured to determine a separately selected source cell, provide a measured digit in the digital output to the separately selected source cell, and provide remaining digits in the digital output to remaining source cells. The measured digit is a flippable digit, and the remaining digits are non-flipping digits. There is one separately selected source cell.

The feedback DAC provides an analog output to the ADC based on the input provided by the measurement selection module.

The measurement module is configured to measure an amplitude of the digital output Dout based on the digital output Dout.

According to the foregoing DAC error measurement apparatus, one flipping digit in the digital output is the measured digit, and the remaining digits are the non-flipping digits. Based on this, a measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

It should be noted that the square wave signal with the constant frequency is selected as an excitation signal, mainly to enable the digital output of the quantizer to provide a measured digit, to measure a matching error of each source cell in the feedback DAC using the measured digit.

In implementation, a frequency of the square wave signal may be obtained through frequency division by a sampling clock, and an amplitude of the square wave signal is relatively small, such that a quantity of recognizable digital statuses in the digital output Dout of the quantizer is controlled to be within a specific range.

It should be noted that, selecting the direct-current signal of the constant logical level as the measurement input has two functions. One function is to change a bias value of an out-of-band gain of the digital output Dout of the quantizer. This helps adjust a quantity of flipping code values of the quantizer to 2. The other function is to make matching errors of all source cells be measured under a same bias condition. In comparison with other approaches, analog outputs provided by all the source cells are equivalently quantized in a same comparator. This helps improve error measurement accuracy.

It should be noted that, to improve measurement accuracy of a matching error of a source cell in the feedback DAC, the loop filter is a reconfigurable loop filter, and the reconfigurable loop filter is mainly embodied in that an input out-of-band gain provided by the loop filter to the quantizer is adjustable. A function of the above is to reduce the quantity of flipping code values of the quantizer by adjusting the input out-of-band gain provided by the loop filter to the quantizer.

In a possible design, when the loop filter provides a low-gain input to the quantizer, because the output of the loop filter is coupled to the input of the quantizer, the quantizer may convert the low-gain input into P digits as the digital output Dout. Only one of the P digits is a flipping digit, and the flipping digit flips between 0 and 1. The digit is referred to as a measured digit. The measured digit is provided to a measured source cell, and other P−1 digits do not flip and are provided to other source cells.

According to the concept of the disclosure, when the direct-current signal changes the bias value of the out-of-band gain of Dout, an element parameter of the loop filter is adjusted to enable the loop filter to provide the low-gain input to the quantizer, to adjust the quantity of the flipping code values of the quantizer to 2. In this way, only one digit in the digital output Dout of the quantizer can flip, and the other digits do not flip.

When the loop filter provides the low-gain input to the quantizer, the digital output Dout provides one flipping digit and P−1 non-flipping digits. This may avoid, by providing the flipping digit to the measured source cell as a measured digit, introducing a matching error of a source cell into an error measurement result of the measured source cell, thereby improving measurement accuracy of a matching error when each source cell is measured.

The loop filter is configured to a reconfigurable loop filter, to further reconfigure the loop filter during DAC error measurement, such that the loop filter provides the low-gain input to the quantizer, one flipping digit in the digital output that is output by the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when the matching error of the separately selected source cell is measured.

In a possible design, the loop filter provides the low-gain input to the quantizer under the control of a control module.

For example, the apparatus further includes the control module. The control module is electrically connected to the loop filter, and the control module is configured to provide a switching enable signal to the loop filter. The switching enable signal is used to control the loop filter to provide the low-gain input to the quantizer.

It should be noted that, based on a re-configurability characteristic of the loop filter, in an ADC working process, the loop filter works in a mode 1. In this case, the loop filter provides a high-gain input to the quantizer, and the out-of-band gain $H_{inf}$ of the digital output Dout of the quantizer is relatively high. In a measurement process of the feedback DAC, the loop filter works in a mode 2. In this case, the loop filter provides the low-gain input to the quantizer, and $H_{inf}$ of the digital output Dout of the quantizer is relatively low. A function of the switching enable signal may be understood as controlling switching of working modes of the loop filter. Before matching error measurement for the feedback DAC starts, the control module sends a switching enable signal to the loop filter, to switch the working mode of the loop filter to the mode 2, such that a loop gain of the loop filter is relatively low in a process of measuring matching errors of all source cells. After the matching error measurement for the feedback DAC, the control module sends a switching enable signal to the loop filter, to switch the working mode of the loop filter to the mode 1. In this case, the loop gain of the loop filter is relatively high.

Optionally, the loop filter adjusts a power-on order quantity of the loop filter based on the switching enable signal sent by the control module, such that the loop filter provides the low-gain input to the quantizer.

It should be noted that, adjusting the power-on order quantity of the loop filter may be understood as switching the power-on order quantity of the loop filter. Assuming that an order quantity of the loop filter is m, when the loop filter is switched to the mode 1, all m orders of the loop filter are powered on. When the loop filter is switched to the mode 2, some of the m orders of the loop filter are powered on, and some are not powered on. Therefore, adjusting the power-on order quantity is switching power-on states of some orders of the loop filter.

Optionally, the loop filter adjusts an element coefficient of the loop filter based on the switching enable signal sent by the control module, such that the loop filter provides the low-gain input to the quantizer. The element coefficient of the loop filter is adjustable. This may be implemented by switching power-on states of some elements.

The element coefficient of the loop filter may include one of or any combination of a plurality of a feedforward resistor, a feedforward capacitor, an input resistor, a summation capacitor, or a summation resistor of a loop filter circuit of an order or some orders.

It should be noted that, using a resistance value of a feedforward resistor of a first-order loop filter circuit as an example, the feedforward resistor of the first-order filter may be configured to be constituted by coupling and connecting a plurality of resistor elements. When the loop filter is switched to the mode 1, power-on states of the plurality of resistor elements in the mode 1 are different from those in the mode 2.

Optionally, the loop filter adjusts a power-on order quantity and an element coefficient of the loop filter based on the switching enable signal sent by the control module, such that the loop filter provides the low-gain input to the quantizer.

Based on re-configurability of the loop filter, when the loop filter is in the mode 2 due to adjustment of the power-on order quantity or the element coefficient, the input low loop gain provided to the quantizer can implement that one flipping digit in the digital output of the quantizer is the measured digit, and the remaining digits are the non-flipping digits. Based on this, the measurement selection module may separately select one source cell to receive the measured digit, and provide the remaining digits to the remaining source cells. In this way, a matching error of a source cell may not be introduced when a matching error of the separately selected source cell is measured. In addition, the direct-current signal in the measurement input is at the constant logical level, such that matching errors of all source cells are measured under a same bias condition, thereby helping improve measurement accuracy of the matching error.

The digital output Dout of the quantizer may be a binary code, or may be a thermometer code. Assuming that a bit quantity of the quantizer is n, if the digital output Dout is the thermometer code, the P digits include $2^n$ digits. If the digital output Dout is the binary code, the P digits include n digits. The DAC error measurement apparatus provided in this application is not only applicable to signal conversion based on the thermometer code, but also applicable to signal conversion based on the binary code.

It should be noted that, because the feedback DAC includes P source cells, after receiving the P digits, the measurement selection module provides the P digits to the P source cells, such that each source cell receives one digit. P is a positive integer greater than 1. A value of P is determined based on an actual circuit of the DAC.

Optionally, the measurement selection module may be controlled by the control module to select a separately selected source cell.

For example, the control module provides a measurement selection signal to the measurement selection module, and the measurement selection signal indicates the separately selected source cell. The measurement selection module performs, based on the received measurement selection signal, overall dislocation adjustment on a conducted electric connection relationship between the P digits and the P source cells, to provide the measured digit to the separately selected source cell, and provide, based on a conducted electric connection relationship obtained after dislocation, remaining P−1 digits to P−1 source cells other than the separately selected source cell.

The digital output Dout based on the quantizer includes one flipping digit used as the measured digit and P−1 non-flipping digits, such that the measurement selection module can provide one measured digit to one source cell. The control module sends a measurement selection signal (for example, SEL=1, . . . , and SEL=P) to the measurement selection module, to control the measurement selection module to separately select one source cell from the P source cells to receive the measured digit each time the measurement selection signal is received, until each source cell is selected once. Compared with other approaches, this method for selecting a to-be-measured source cell can simplify circuit design and is easy to implement.

During each measurement, each source cell receives one digit, but only one source cell is separately selected to receive one measured digit (one flipping digit), and digits received by other source cells are non-flipping digits.

In P measurement processes, the control module successively provides P measurement selection signals to the measurement selection module, where separately selected source cells indicated by the P measurement selection signals are different from each other. The measurement selection module receives the P measurement selection signals successively provided by the control module, and performs overall dislocation adjustment on the conducted electric connection relationship between the P digits and the P source cells once each time one of the measurement selection signals is received, until the P source cells are all measured.

In P measurement processes, the control module successively provides P measurement selection signals to the measurement selection module, and the separately selected source cells indicated by the P measurement selection signals are different from each other, such that the measurement selection module performs overall dislocation adjustment on the conducted electric connection relationship between the P digits and the P source cells once each time one of the measurement selection signals is received, until the P source cells are separately selected to receive the measured digit.

It should be noted that, during each measurement, the feedback DAC provides the analog output to the loop filter based on a current or a voltage provided by the P source cells. The feedback DAC in this application may have a current steering structure or another structure.

Optionally, the apparatus further includes a digital filter circuit, where an output of the quantizer is coupled to an input of the digital filter circuit, and where an output of the digital filter circuit is coupled to an input of the measurement circuit. The digital filter circuit is configured to filter out a high-frequency part from the digital output, and provide, to the measurement module, a digital output from which the high-frequency part is filtered out. The measurement module is configured to measure an amplitude of the digital output from which the high-frequency part is filtered out. After the digital filter circuit filters out a high-frequency signal from the digital output, impact of an interference signal on error measurement can be eliminated, thereby improving error measurement accuracy.

Optionally, the measurement module may be a discrete Fourier transform circuit with a constant frequency, and a function of the measurement module is to perform digital fixed-point measurement, to measure a digital amplitude of one digit in digits into which an analog output of a source cell selected to be measured is converted. The measurement module in this application may be configured to measure a step height of the DAC. If the feedback DAC has a current steering structure, an amplitude value of a source cell Icell is to be measured. If the feedback DAC has another structure, a to-be-measured value may be replaced with an amplitude value of another physical quantity.

Optionally, the apparatus further includes an error calculation module, where the error calculation module is connected to the measurement module. The error calculation module is configured to: obtain, from the measurement module, amplitudes measured by the measurement module when the P source cells are measured; determine an average amplitude value of the P source cells based on the obtained amplitudes; and determine a matching error of each of the P source cells based on the average amplitude value. Based on the foregoing embodiment, the loop gain of the loop filter is adjustable, and the direct-current signal in the measurement input is at the constant logical level, such that one flipping digit in the digital output is the measured digit, and the remaining digits are the non-flipping digits. In this way, a matching error of a source cell may not be introduced when a matching error of the separately selected source cell is measured. Matching errors of all source cells are measured under a same bias condition. On the premise that two errors that are possibly to be introduced are avoided, an error calculation algorithm in this application is simplified. The algorithm used in this application is simple but reliable, and a matching error of each source cell can be accurately measured for the digital output of the P source cells.

Optionally, the apparatus further includes a first signal source and a second signal source. The first signal source provides a square wave signal within measurement duration of the P source cells, the second signal source provides a direct-current signal within the measurement duration of the P source cells, and the first signal source and the second signal source are obtained by reusing a circuit structure of a source cell. Reusing a circuit structure of a source cell of the DAC can reduce circuit costs of a bias signal source (a signal source that provides the direct-current signal) and an excitation signal source (a signal source that provides the square wave signal), and the bias signal source and the excitation signal source better match a source cell of the feedback DAC. This helps avoid introducing a matching error between the excitation signal source and the bias signal source to an error measurement result.

Optionally, the control module is further configured to ground an analog input U of the ADC before the P source cells of the DAC start to be measured. The analog input U is an analog signal input by the ADC in a signal processing mode (a mode 1).

Optionally, the control module is further configured to set the measurement module, the first signal source, the second signal source, and the error calculation module to power-on states before the P source cells of the DAC start to be measured.

Optionally, the control module is further configured such that after measurement of the P source cells of the DAC is completed, the control module provides a switching enable signal to the measurement selection module, to switch a power-on order quantity of the loop filter and/or switch an element coefficient of the loop filter. As such, the loop filter provides a high-gain input to the quantizer, in other words, the loop filter is switched from an error measurement mode (a mode 2) to the signal processing mode (the mode 1).

Optionally, after measurement of the P source cells of the DAC is completed, the square wave signal and the direct-current signal are set to power-down states, and the measurement module is set to a power-down state.

The following describes in detail the DAC error measurement apparatus shown in FIG. 2A with reference to an example.

Figure 2B:
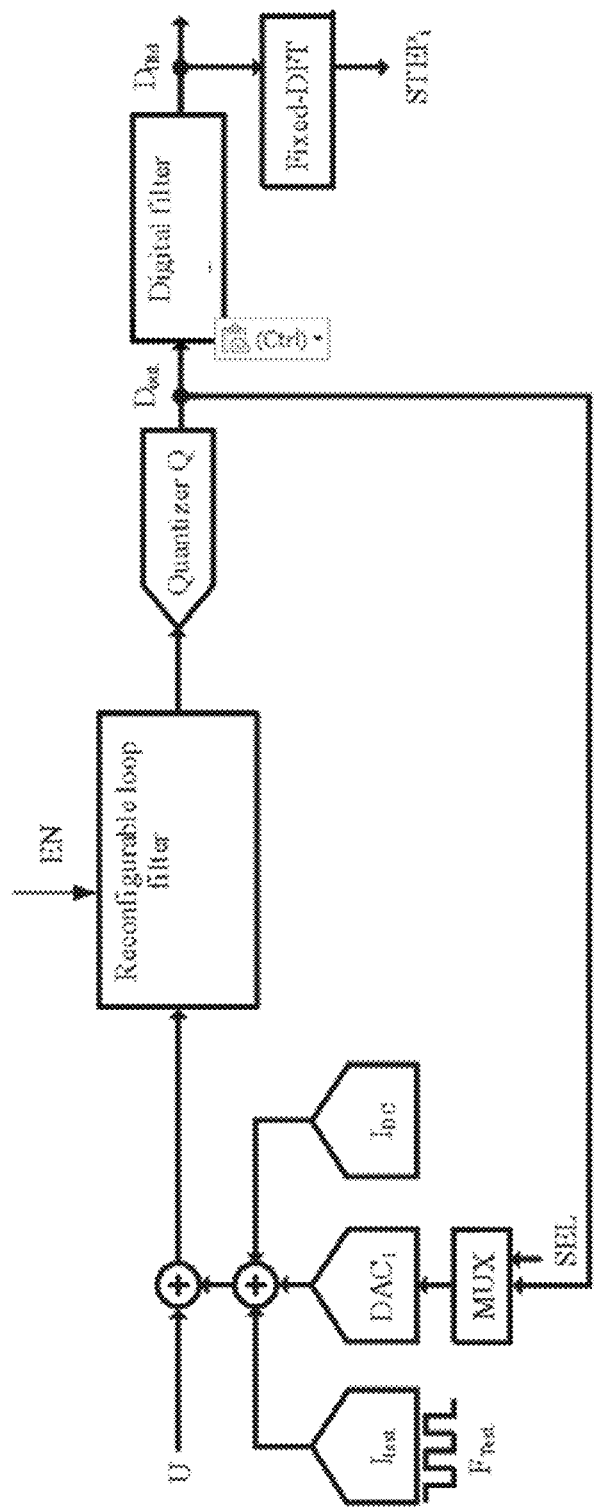
FIG. 2B is a schematic structural diagram of a DAC error measurement apparatus according to an embodiment of this application.

FIG. 2B shows a DAC error measurement apparatus. The apparatus may be an ADC or a DSM. The apparatus includes: a loop filter, a quantizer, a multiplexer (MUX) switch MUX, a DAC1, a digital filter, and a Fourier transform fixed-discrete Fourier transform (DFT) circuit of a constant frequency (a digital fixed point). A measurement input of the loop filter includes a square wave signal provided by a signal source $I_{Test}$, a constant direct-current signal provided by a signal source $I_{DC}$, and an analog output of the DAC 1.

The loop filter is a reconfigurable loop filter, and an order quantity of the loop filter is 4. A bit quantity of the quantizer is 4. An example in which a digital output of the quantizer is a thermometer code is used. The thermometer code is 16 bits, and the digital output Dout includes 16 digits. Mode switching of the reconfigurable loop filter is controlled by a switching enable signal EN. When the EN switches a mode of the loop filter to a mode 2, the loop filter provides a low-gain input. In this case, only one non-flipping digit of the 16 digits of Dout is used as a measured digit, and remaining 15 digits do not flip.

The DAC 1 is the feedback DAC in the foregoing embodiment. The DAC 1 includes 16 source cells, and dislocation switching is performed by the MUX on a conducted electric connection relationship between the 16 source cells and the 16 digits of Dout.

The MUX is the measurement selection module in the foregoing embodiment, and the MUX determines, based on a measurement selection signal SEL, a source cell that is separately selected to receive the measured digit. Each time the MUX receives one SEL, overall dislocation is performed on the conducted electric connection relationship between the 16 source cells and the 16 digits once. In an electric connection relationship obtained after dislocation, one source cell selected using the SEL and one digit may be conducted, and remaining source cells and remaining 15 non-flipping digits may be conducted. The 16 source cells are selected in turn to separately receive the measured digit, and a total of 16 times of selection need to be performed. Therefore, the MUX needs to perform overall dislocation on the conducted electric connection relationship between the 16 source cells and the 16 digits for 16 times, until the 16 source cells are selected in turn to be conducted to one flipping digit.

The digital filter performs down-sampling and digital filtering on Dout, filters out a high-frequency part in Dout, and outputs a digital output $D_{fltd}$ from which the high-frequency part is filtered out.

The fixed-DFT circuit is the measurement module in the foregoing embodiment. The fixed-DFT circuit performs calculation on the output result $D_{fltd}$ of the digital filter, and calculates an amplitude value $STEP_i$ of a digital output corresponding to the source cell that is selected to separately receive the measured digit. A value of i ranges from 1 to 16.

Figure 3:
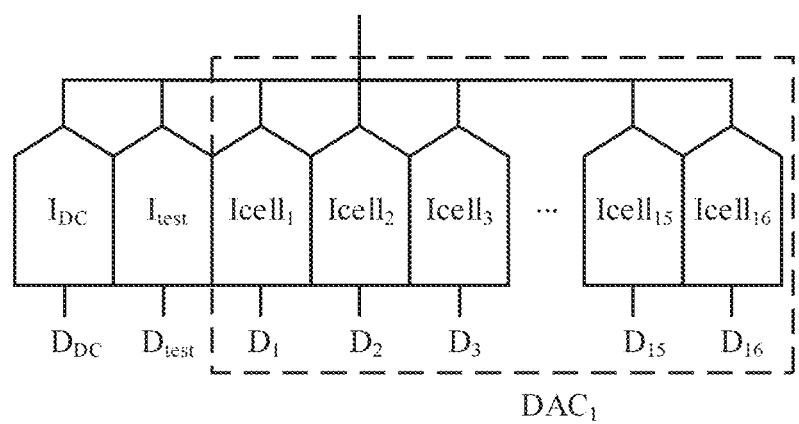
FIG. 3 is a schematic structural diagram of a feedback DAC according to an embodiment of this application.

Optionally, to reduce a matching error between the signal source $I_{Test}$ and the signal source $I_{DC}$ and the 16 source cells, as shown in FIG. 3, a circuit of the signal source $I_{Test}$ and a circuit of the signal source $I_{DC}$ are obtained by reusing a circuit of a single source cell. Component structures of the signal source $I_{Test}$ and the signal source $I_{DC}$ may be formed together with the 16 source cells in a same process. In this way, circuit implementation is simple and costs are reduced.

As shown in FIG. 3, for the 16 source cells included in the feedback DAC 1, refer to FIG. 3. The 16 source cells are $Icell_1$ to $Icell_{16}$. Although subscript values of $Icell_1$ to $Icell_{16}$ are different, $Icell_1$ to $Icell_{16}$ have completely same circuit structures, and jointly constitute the $DAC_1$. $I_{test}$ and $I_{DC}$ may be implemented using a structure circuit similar to that of $Icell_i$, and are combined with $Icell_i$ in a layout, such that matching among $I_{test}$, $I_{DC}$, and $Icell_i$ is enhanced. $D_{DC}$ controls a size of $I_{DC}$. In the mode 2, $D_{DC}$ is set to a constant value +1 or −1. Whether $D_{DC}$ is set to the constant value +1 or −1 does not affect the ADC in the DSM. In a mode 1, $I_{DC}$ does not work. $D_{test}$ controls $I_{test}$. In the mode 2, $D_{test}$ is set to a square wave signal that fluctuates between ±1, and the square wave signal can be obtained through frequency division by a sampling clock.

The following describes in detail implementation of the reconfigurable loop filter in the feedback DAC matching error measurement apparatus with reference to an example.

Figure 4A:
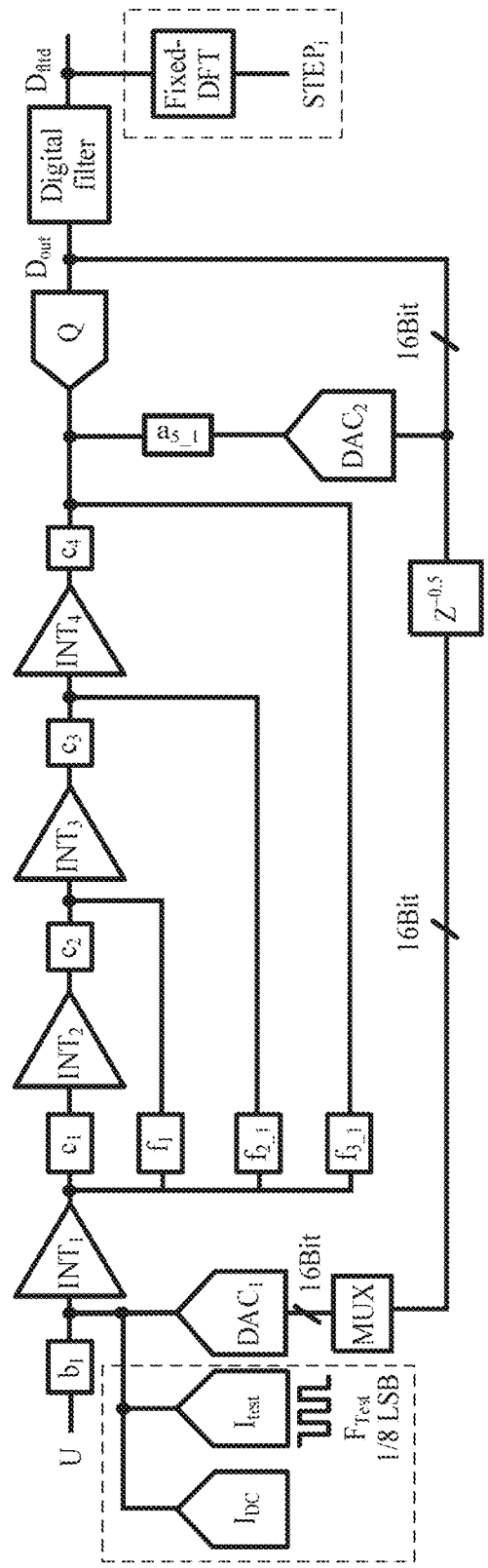
FIG. 4A is a schematic structural diagram of a DAC error measurement apparatus in a mode 1 according to Embodiment 1 of this application.

FIG. 4A and FIG. 6(b) show a first example in which the reconfigurable loop filter is in a mode 1 and a mode 2 respectively. In this example, $H_{inf}$ is reduced by adjusting a power-on order quantity of the loop filter. Circuits of the reconfigurable filter shown in FIG. 4A and FIG. 4B may be applied to an ADC with a continuous-time DSM structure, and may also be applied to the DT field.

FIG. 4A shows a detailed circuit of the reconfigurable loop filter in the mode 1. An order quantity of the loop filter is 4, a bit quantity of a quantizer is 4 (a thermometer code is 16 bits), and $H_{inf}$ may be adjusted according to an actual application, and is generally 4 to 6. In FIG. 4A, modules $I_{DC}$, $I_{test}$, and fixed-DFT become gray. This means that in the mode 1, the modules $I_{DC}$, $I_{test}$, and fixed-DFT are in a non-working state, but a 4-order filter circuit of the loop filter is in an enabled and power-on state. In the 4-order filter circuit of the loop filter, $INT_1$ is a first-stage integrator, $INT_2$ is a second-stage integrator, $INT_3$ is a third-stage integrator, and $INT_4$ is a fourth-stage integrator. $b_1$ is an input coefficient of the first-stage integrator, $c_1$ is an output coefficient of the first-stage integrator, $c_2$ is an output coefficient of the second-stage integrator, $c_3$ is an output coefficient of the third-stage integrator, $c_4$ is an output coefficient of the fourth-stage integrator, $a_5$ is an excess loop delay (ELD) compensation coefficient, $f_1$ is a first-order feedforward coefficient, $f_2$ is a second-order feedforward coefficient, and $f_3$ is a third-order feedforward coefficient.

Figure 4B:
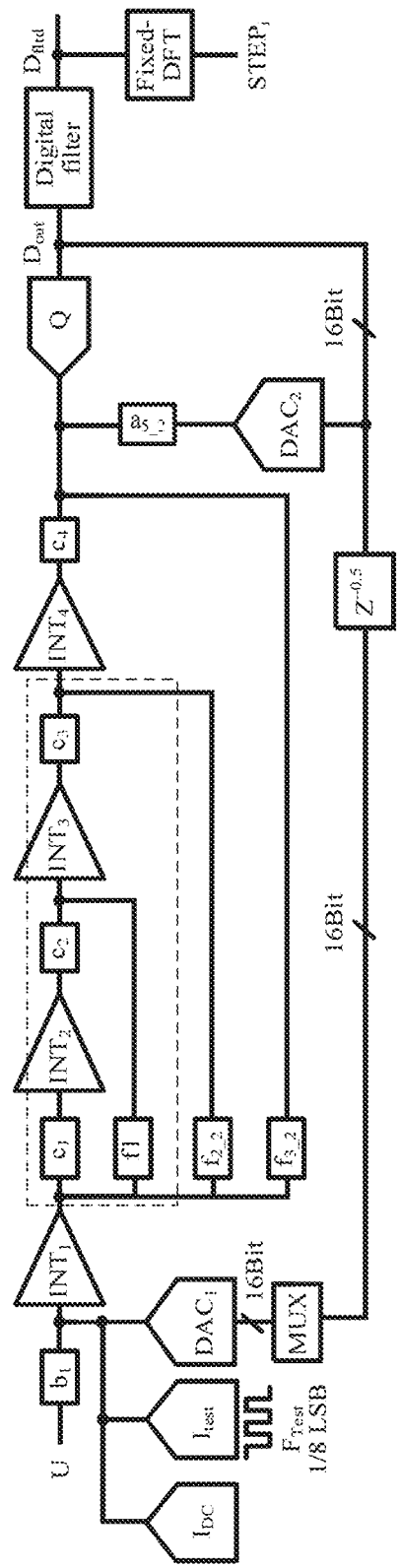
FIG. 4B is a schematic structural diagram of a DAC error measurement apparatus in a mode 2 according to Embodiment 1 of this application.

FIG. 4B shows a detailed circuit of the reconfigurable loop filter in the mode 2. In the mode 2, modules $I_{DC}$, $I_{test}$, and fixed-DFT are in a power-on state, but a power-on order quantity of the loop filter is reduced to 2. A part whose color becomes dark is in a power-off state, and $INT_2$ and $INT_3$ are not powered on. The output coefficient $c_1$ of the first-stage integrator, the output coefficient $c_2$ of the second-stage integrator, the output coefficient $c_3$ of the third-stage integrator, and the first-order feedforward coefficient $f_1$ are disconnected from a loop through a switch. In this way, in the 4-order filter circuit of the loop filter, only a related element of a 2-order filter circuit is in a power-on state.

It is found through simulation that when a value of $H_{inf}$ is reduced to a value less than 2, a flipping code value of Icell does not exceed 2.

FIG. 5A shows a simulation result of an out-of-band gain of corresponding $D_{out}$ in the mode 1 (the detailed circuit shown in FIG. 4A). It can be seen from the emulation result that, in this case, $H_{inf}=4$, and $D_{out}$ outputs mainly four generated flipping code values: 0.125, 0, −0.125, and −0.25. In this case, there are four statuses of 16 digits output by $D_{out}$. Correspondingly, a plurality of the 16 digits output by $D_{out}$ flip between 0 and 1. As a result, a matching error of a source cell is introduced when each source cell is measured. Therefore, a measurement error of a matching error of the source cell is relatively large.

Figure 5B:
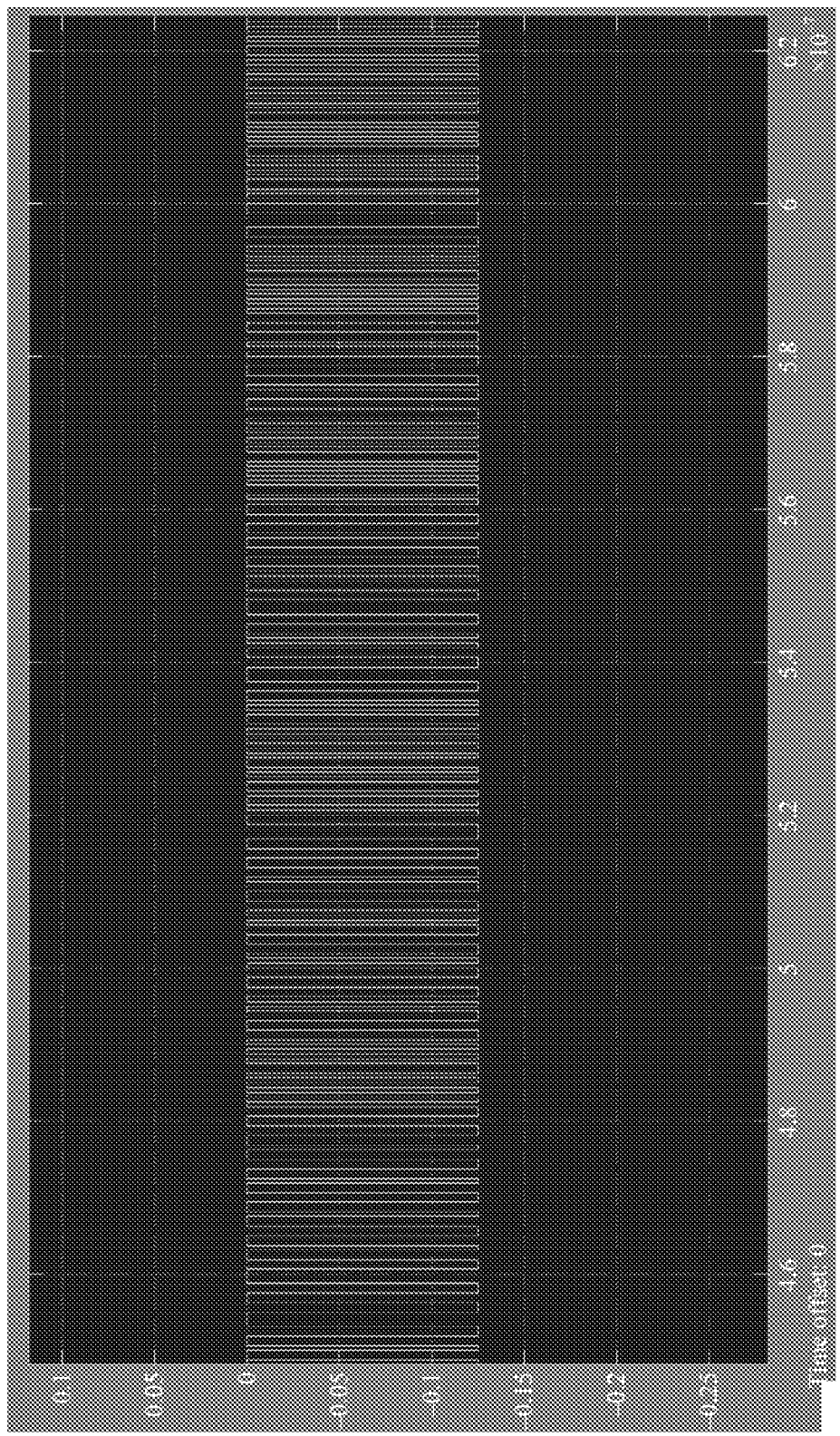
FIG. 5B is a schematic diagram of a $D_{out}$ time domain output waveform of a DAC error measurement apparatus in a mode 2 according to Embodiment 1 of this application.

FIG. 5B shows a simulation result of an out-of-band gain of corresponding $D_{out}$ in the mode 2 (the detailed circuit shown in FIG. 4B). It can be seen from the emulation result that, in this case, $H_{inf}=1.5$, and $D_{out}$ outputs only two generated flipping code values: 0 and −0.125. In this case, $D_{out}$ outputs the only two generated flipping code values, such that there are two statuses of 16 digits output by $D_{out}$. Correspondingly, only one of the 16 digits output by $D_{out}$ flips between 0 and 1. In this way, a matching error of each source cell is not introduced when another source cell is measured. Therefore, measurement accuracy of a matching error of a source cell is improved.

Figure 6:
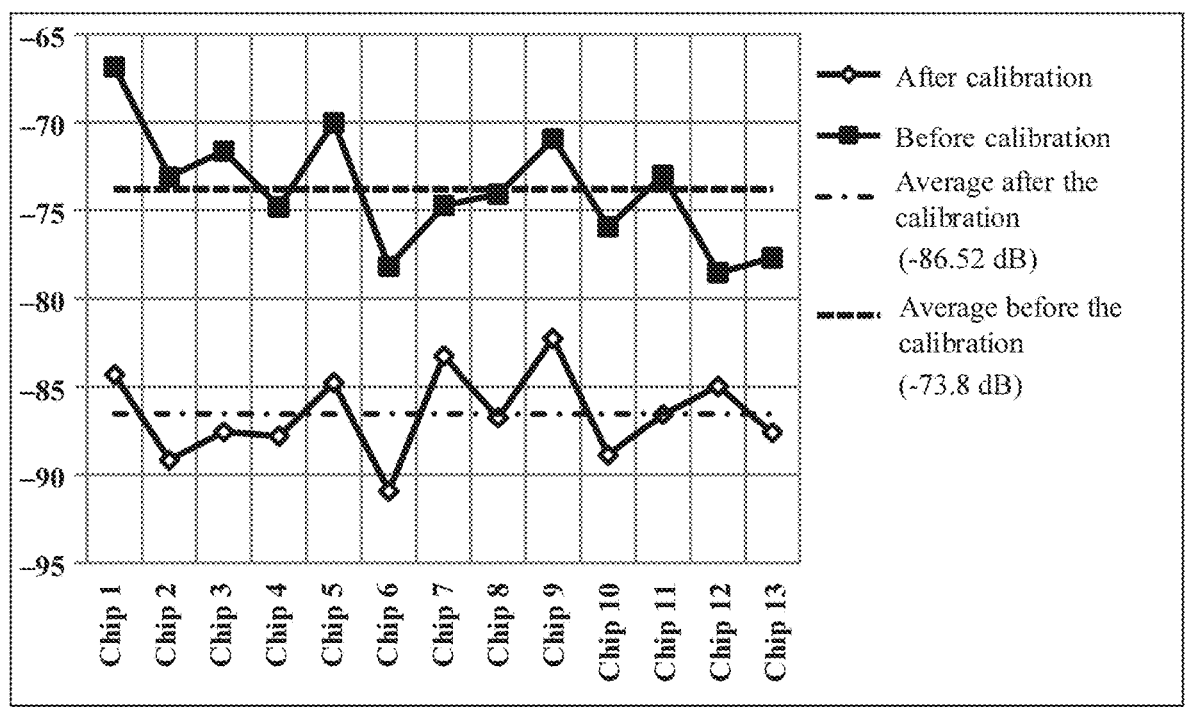
FIG. 6 is a schematic diagram of comparison between THD simulation results before and after DAC error correction according to Embodiment 1 of this application.

To verify feasibility of a DAC error test solution in Example 1 of this application, after error measurement is performed based on a solution in which the loop filter is reconfigurable in Example 1 of this application, error calibration is performed on the feedback DAC based on a measured matching error of the feedback DAC, and a THD before calibration and a THD after calibration are simulated. In this application, 13 chips are randomly selected as samples for testing, and each chip includes a related circuit of the error measurement apparatus in this embodiment of this application. THDs of the 13 chips before DAC matching error calibration fluctuate between −67 decibels (dB) and −78 dB. An average THD value of the 13 chips before the calibration is −73.8 dB. Then, after DAC matching error calibration is performed on the 13 chips based on a DAC matching error measurement result obtained in an error measurement manner in Example 1 of this application, the THDs of the 13 chips are simulated, to obtain distribution of THDs of the 13 chips after the calibration. As shown in FIG. 6. The distribution of the THDs of the 13 chips after the calibration fluctuates between −84 dB and −92 dB. An average THD value of the 13 chips after the calibration is −86.52 dB. It can be found through comparison that, compared with the average THD value of the 13 chips before the DAC matching error calibration, the average THD value of the 13 chips after the calibration increases by 12 dB. It can be learned that, based on the foregoing first solution in which the loop filter is reconfigurable, error measurement performed on the DAC error measurement apparatus provided in this embodiment of this application helps improve an overall linear indicator of the ADC. Therefore, from this perspective, the DAC error measurement method provided in this application is feasible to improve error measurement accuracy.

Figure 7A:
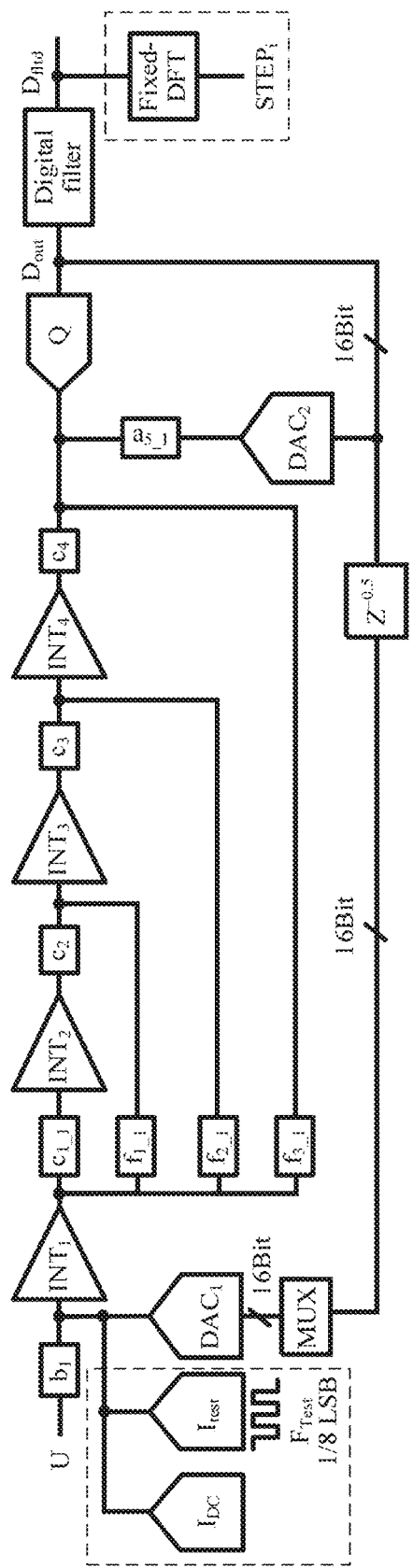
FIG. 7A is a schematic structural diagram of a DAC error measurement apparatus in a mode 1 according to Embodiment 2 of this application.
Figure 7B:
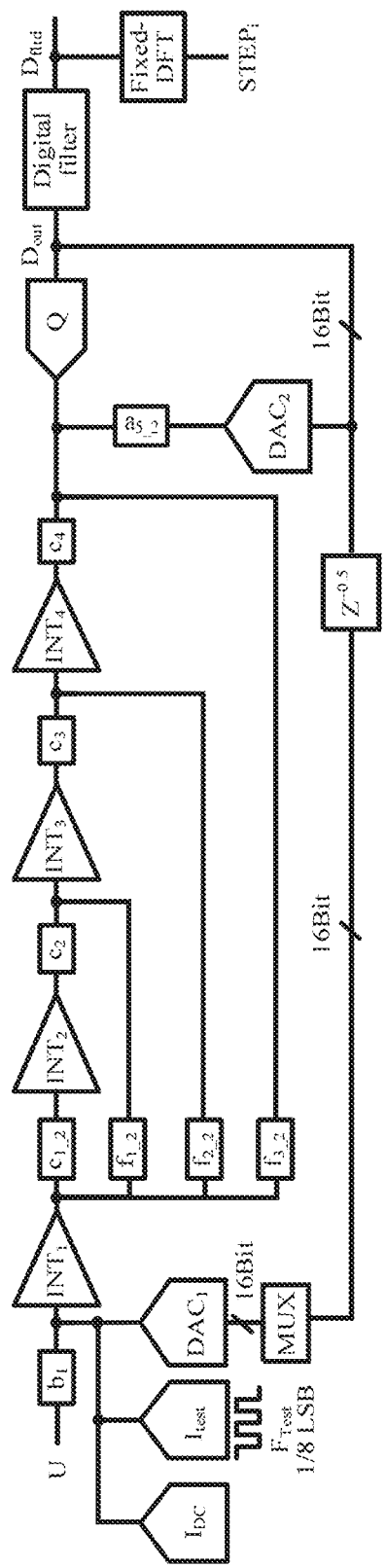
FIG. 7B is a schematic structural diagram of a DAC error measurement apparatus in a mode 2 according to Embodiment 2 of this application.

FIG. 7A and FIG. 7B show another example in which the reconfigurable loop filter is in a mode 1 and a mode 2 respectively. A difference from Example 1 lies in that in this example, $H_{inf}$ is reduced by adjusting an element coefficient. When the DSM works in the mode 1, a value of $H_{inf}$ is relatively high. When the mode is switched to the mode 2, coefficients $S^{-4}$, $S^{-3}$, $S^{-2}$, $S^{-1}$, and $S^0$ of the loop filter are adjusted. For a detailed adjustment table, refer to Table 1. $H_{inf}$ can also be reduced to a value less than 2 by adjusting the coefficients.

Optionally, the coefficients of the loop filter that need to be adjusted include element coefficients $c_1$, $f_1$, $f_2$, $f_3$, and $a_5$. In Table 1, coefficients of $c_1$, $f_1$, $f_2$, $f_3$, and $a_5$ in the mode 1 are $c_{1\_1}$, $f_{1\_1}$, $f_{2\_1}$, $f_{3\_1}$, and $a_{5\_1}$ respectively. Coefficients of $c_1$, $f_1$, $f_2$, $f_3$, and $a_5$ in the mode 2 are $c_{1\_2}$, $f_{1\_2}$, $f_{2\_2}$, $f_{3\_2}$, and $a_{5\_2}$ respectively. When a matching error of the feedback DAC is measured, the element coefficients $c_{1\_1}$, $f_{1\_1}$, $f_{2\_1}$, $f_{3\_1}$, and $a_{5\_1}$ are switched to $c_{1\_2}$, $f_{1\_2}$, $f_{2\_2}$, $f_{3\_2}$, and $a_{5\_2}$ respectively based on a switching enable signal EN_2, such that the loop filter is switched from the mode 1 to the mode 2. In reverse, after measurement of the matching error of the feedback DAC ends, the element coefficients $c_{1\_2}$, $f_{1\_2}$, $f_{2\_2}$, $f_{3\_2}$, and $a_{5\_2}$ are switched to $c_{1\_1}$, $f_{1\_1}$, $f_{2\_1}$, $f_{3\_1}$, and $a_{5\_1}$ respectively based on a switching enable signal EN_1, such that the loop filter is switched from the mode 2 to the mode 1.

TABLE 1

| Coefficient of a filter | Mode 1 | Mode 2 |
|---|---|---|
| $S^{-4}$ | $c_{1\_1}$ | $c_{1\_2}$ |
| $S^{-3}$ | $f_{1\_1}$ | $f_{1\_2}$ |
| $S^{-2}$ | $f_{2\_1}$ | $f_{2\_2}$ |
| $S^{-1}$ | $f_{3\_1}$ | $f_{3\_2}$ |
| $S^0$ | $a_{5\_1}$ | $a_{5\_2}$ |

Based on the manner in which the loop filter is reconfigurable in Example 2 of this application, it is found, by simulating a time-domain output waveform of the output $D_{out}$ of the quantizer, that a value of $H_{inf}$ may be reduced to a value less than 2. In this case, a flipping code value of Icell does not exceed 2.

Figure 8A:
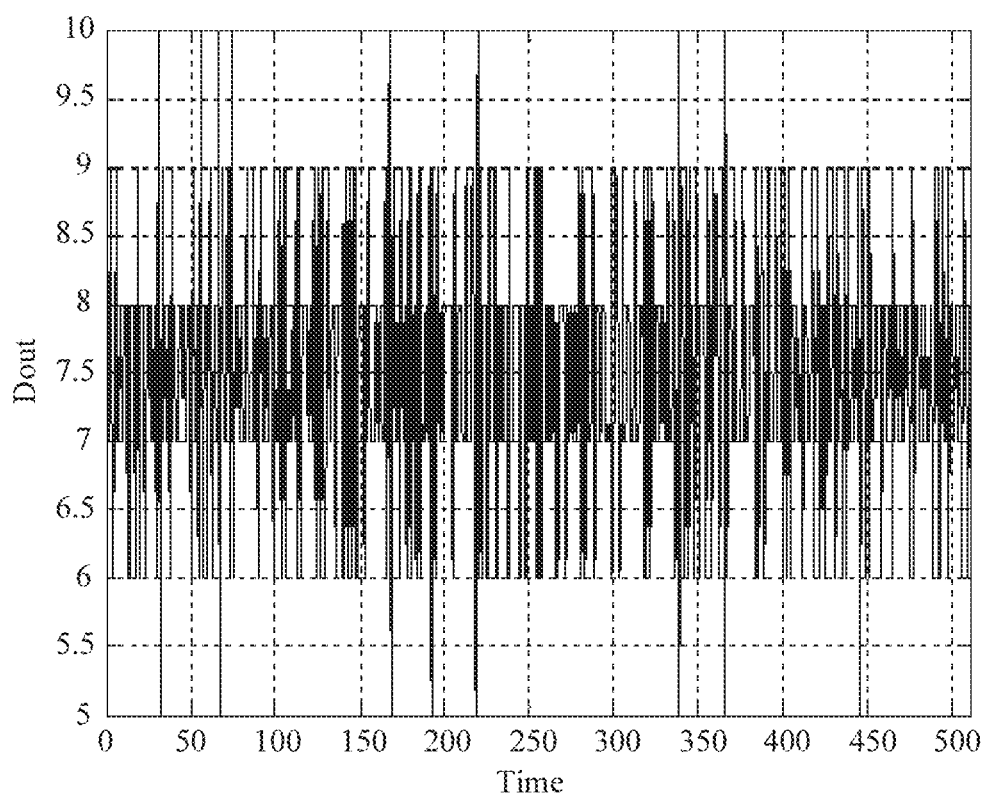
FIG. 8A and FIG. 8B are schematic diagrams of $D_{out}$ time domain output waveforms of a DAC error measurement apparatus in a mode 1 according to Embodiment 2 of this application.
Figure 8B:
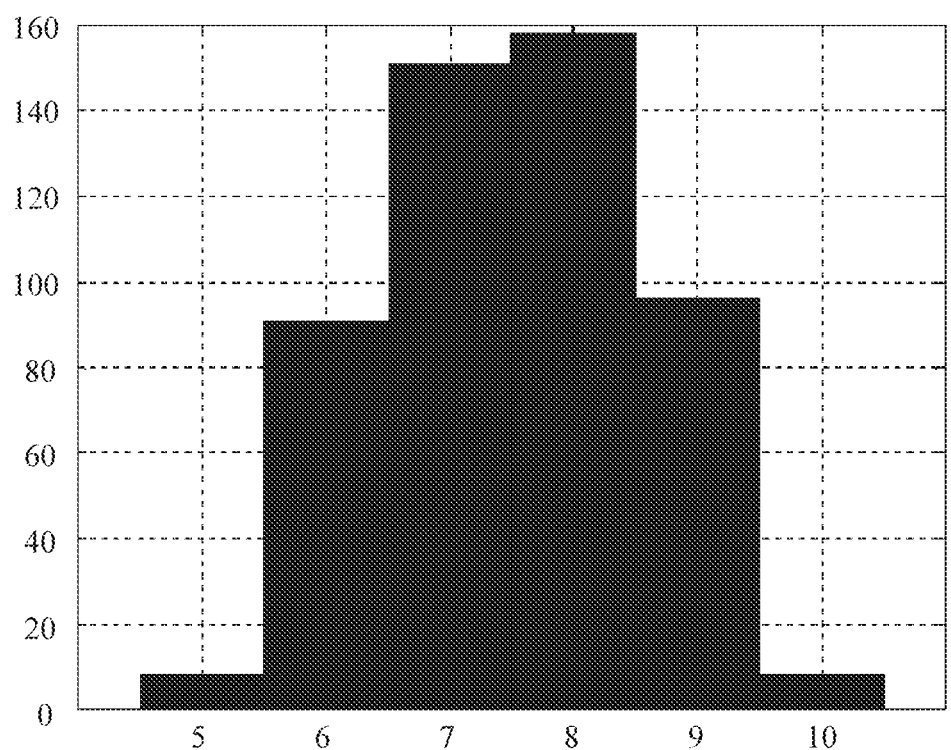

FIG. 8A shows a time-domain output waveform of corresponding $D_{out}$ when the circuit in Example 2 is in the mode 1, and FIG. 8B shows distribution of flipping code values of corresponding $D_{out}$ when the circuit in Example 2 is in the mode 1. It can be seen that there are six flipping code values distributed in the time-domain output waveform of $D_{out}$, and a quantity of flipping code values is greater than 2. In this case, there are six statuses of 16 digits output by $D_{out}$. Correspondingly, a plurality of the 16 digits output by $D_{out}$ flip between 0 and 1. As a result, a matching error of a source cell is introduced when each source cell is measured. Therefore, a measurement error of a matching error of the source cell is relatively large.

Figure 9A:
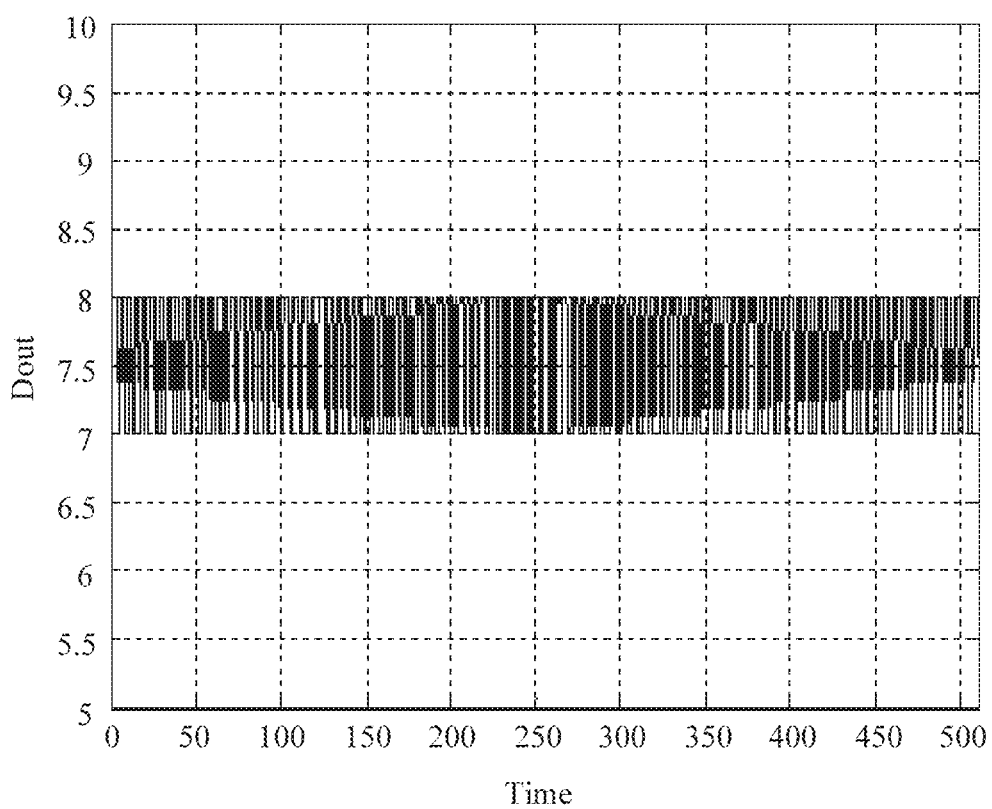
FIG. 9A and FIG. 9B are schematic diagrams of $D_{out}$ time domain output waveforms of a DAC error measurement apparatus in a mode 2 according to Embodiment 2 of this application.
Figure 9B:
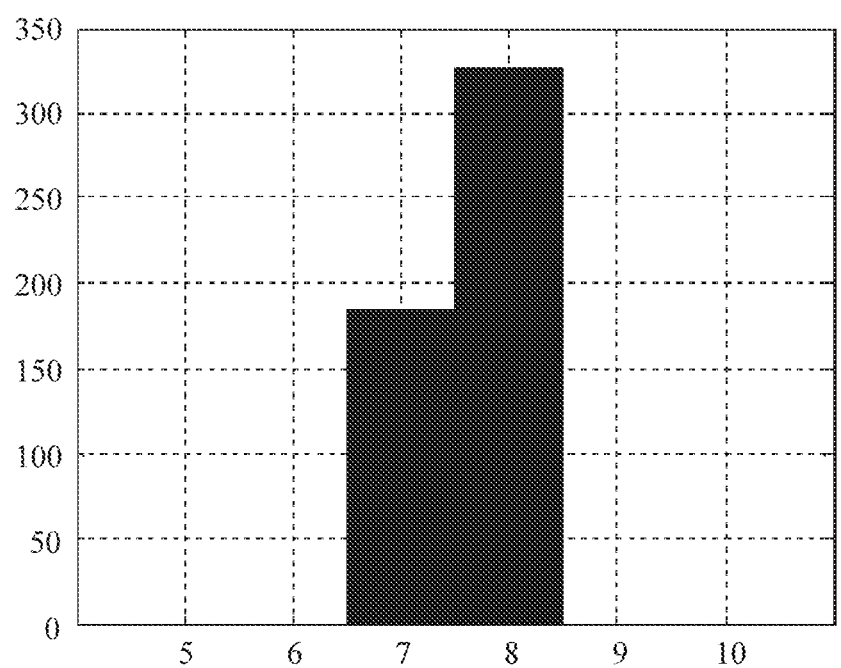

FIG. 9A shows a time-domain output waveform of corresponding $D_{out}$ when the circuit in Example 2 is in the mode 2, and FIG. 9B shows distribution of flipping code values of corresponding $D_{out}$ when the circuit in Example 2 is in the mode 2. It can be seen that there are two flipping code values distributed in the time-domain output waveform of $D_{out}$, and a quantity of flipping code values is equal to 2. In this case, there are two statuses of 16 digits output by $D_{out}$. Correspondingly, only one of the 16 digits output by $D_{out}$ flips between 0 and 1. In this way, a matching error of each source cell is not introduced when another source cell is measured. Therefore, measurement accuracy of a matching error of a source cell is improved.

The following uses the apparatus shown in FIG. 2B as an example to describe how the MUX switches the conducted electric connection relationship between the 16 source cells and the 16 digits in a measurement process of the 16 source cells, and how to select one source cell from the 16 source cells to receive one flipping digit.

TABLE 2

| State 1 | | | | | | | |
|---|---|---|---|---|---|---|---|
| $Dout_1$ | $Dout_2$ | $Dout_3$ | $Dout_4$ | $Dout_5$ | $Dout_6$ | $Dout_7$ | $Dout_8$ |
| 1 | 1 | 1 | 1 | 1 | 1 | 1 | 0 |
| $Dout_9$ | $Dout_{10}$ | $Dout_{11}$ | $Dout_{12}$ | $Dout_{13}$ | $Dout_{14}$ | $Dout_{15}$ | $Dout_{16}$ |
| 0 | 0 | 0 | 0 | 0 | 0 | 0 | 0 |
| State 2 | | | | | | | |
| $Dout_1$ | $Dout_2$ | $Dout_3$ | $Dout_4$ | $Dout_5$ | $Dout_6$ | $Dout_7$ | $Dout_8$ |
| 1 | 1 | 1 | 1 | 1 | 1 | 1 | 1 |
| $Dout_9$ | $Dout_{10}$ | $Dout_{11}$ | $Dout_{12}$ | $Dout_{13}$ | $Dout_{14}$ | $Dout_{15}$ | $Dout_{16}$ |
| 0 | 0 | 0 | 0 | 0 | 0 | 0 | 0 |

An example in which the bit quantity of the quantizer is 4 in FIG. 2B is still used. The thermometer code is still 16 bits. In other words, 16 Icells are required to be coupled to the thermometer code. FIG. 3 is still used as an example of the feedback DAC 1, and the feedback DAC 1 includes 16 source cells: $Icell_1$ to $Icell_{16}$. Digital inputs of $Icell_1$ to $Icell_{16}$ are denoted as $D_1$ to $D_{16}$, and $D_1$ to $D_{16}$ are provided by a connection terminal used for a digital output in the MUX.

It is assumed that 16 digits of $D_{out}$ are denoted as $Dout_1$ to $Dout_{16}$. Connection terminals used for a digital input in the multiplexer switch MUX respectively receive $Dout_1$ to $Dout_{16}$, and connection terminals used for a digital output in the MUX respectively provide $D_1$ to $D_{16}$ to $Icell_1$ to $Icell_{16}$. For two digital statuses presented by $Dout_1$ to $Dout_{16}$ when the loop filter works in the mode 2, refer to Table 2.

Each time the MUX receives one SEL, the MUX selects, based on the received SEL, one source cell to receive one flipping digit. Implementation is as follows.

Figure 10A:
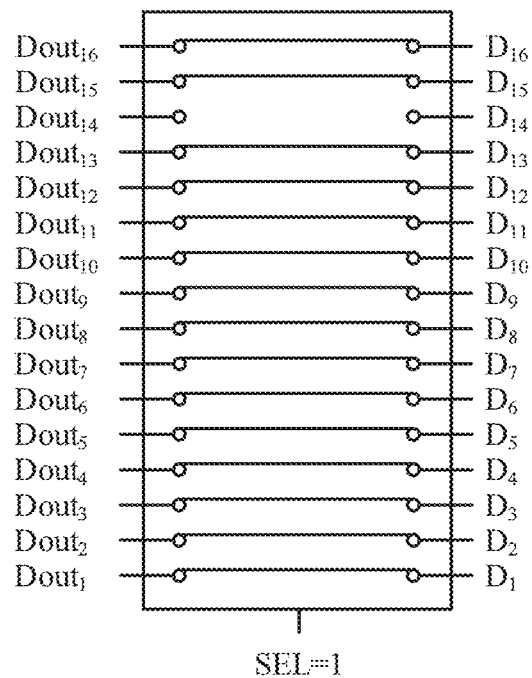
FIG. 10A shows a conducted electric connection relationship between P source cells and P digits output by a quantizer when SEL=1 according to an embodiment of this application.

FIG. 10A shows connected states of connection terminals inside a multiplexer switch MUX when the MUX receives SEL=1. In this case, $Dout_1$ to $Dout_{16}$ correspond to $D_1$ to $D_{16}$. When the loop filter works in the mode 1, SEL=1 is set by default. When the loop filter works in the mode 2 and when SEL=1, if only $Dout_8$ in $Dout_1$ to $Dout_{16}$ flips from 0 to 1 or from 1 to 0 (values of $Dout_1$ to $Dout_7$ are 1, and values of $Dout_9$ to $Dout_{16}$ are 0), after $D_1$ to $D_{16}$ pass through a MUX circuit shown in FIG. 4A, only $D_8$ in $D_1$ to $D_{16}$ flips from 0 to 1 or from 1 to 0 (values of $D_1$ to $D_7$ are 1, and values of $D_9$ to $D_{16}$ are 0). An amplitude of $Icell_8$ can be measured through a digital fixed-point fixed-DFT circuit.

Therefore, when SEL=1, the MUX selects $Icell_8$ to receive a measured digit flipping between 0 and 1, an amplitude value measured by the fixed-DFT circuit is an amplitude value of $Icell_8$, and the amplitude value of $Icell_8$ is an amplitude value obtained after the loop filter and the quantizer convert an analog output of $Icell_8$ into a digital signal and the digital filter filters out a high-frequency part of the digital signal.

Figure 10B:
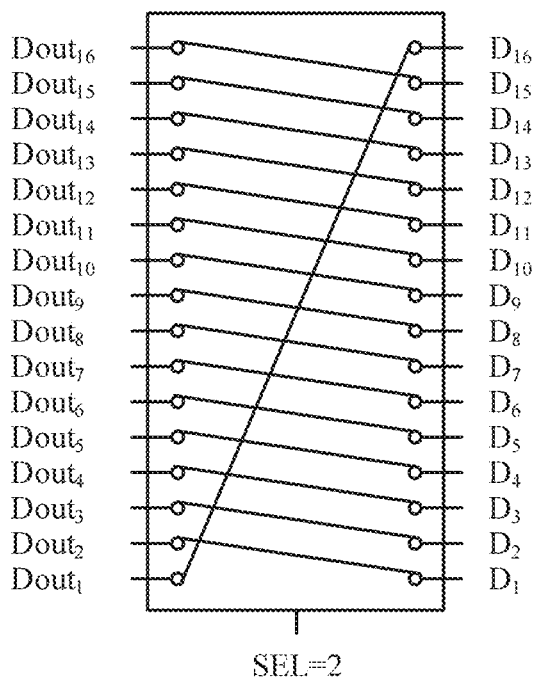
FIG. 10B shows a conducted electric connection relationship between P source cells and P digits output by a quantizer when SEL=2 according to an embodiment of this application.

FIG. 10B shows a connected state of a connection terminal inside a multiplexer switch MUX when the MUX receives SEL=2. A conducted relationship between $Dout_1$ to $Dout_{16}$ and $D_1$ to $D_{16}$ is dislocated once. After the dislocation, $Dout_2$ to $Dout_{16}$ correspond to $D_1$ to $D_{15}$, and $Dout_1$ corresponds to $D_{16}$. When the loop filter works in the mode 2 and when SEL=2, because only $Dout_8$ in $Dout_1$ to $Dout_{16}$ flips from 0 to 1 or from 1 to 0 (values of $Dout_1$ to $Dout_7$ are 1, and values of $Dout_9$ to $Dout_{16}$ are 0), after $D_1$ to $D_{16}$ pass through a MUX circuit shown in FIG. 4B, only $D_7$ in $D_1$ to $D_{16}$ flips from 0 to 1 or from 1 to 0 (values of $D_{16}$ and $D_1$ to $D_6$ are 1, and values of $D_8$ to $D_{15}$ are 0). An amplitude of $Icell_7$ can be measured through a digital fixed-point fixed-DFT circuit.

Therefore, when SEL=2, the MUX selects $Icell_7$ to receive a measured digit flipping between 0 and 1, an amplitude value measured by the fixed-DFT circuit is an amplitude value of $Icell_7$, and the amplitude value of $Icell_7$ is an amplitude value obtained after the loop filter and the quantizer convert an analog output of $Icell_7$ into a digital signal and the digital filter filters out a high-frequency part of the digital signal.

Figure 10C:
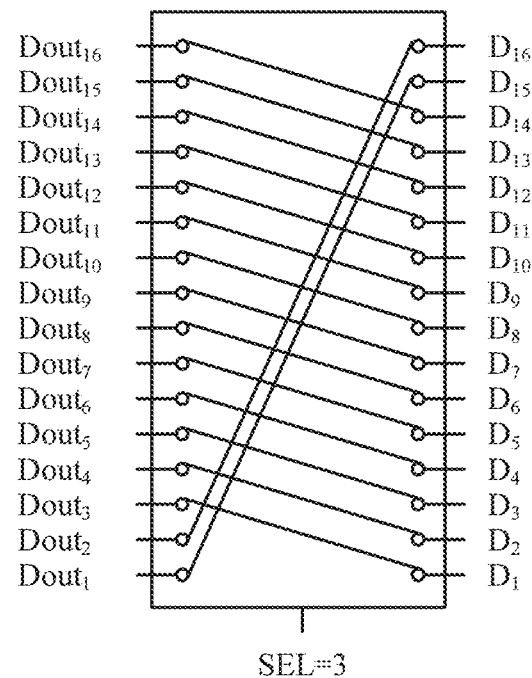
FIG. 10C shows a conducted electric connection relationship between P source cells and P digits output by a quantizer when SEL=3 according to an embodiment of this application.

FIG. 10C shows a connected state of a connection terminal inside a multiplexer switch MUX when the MUX receives SEL=3. A conducted relationship between $Dout_1$ to $Dout_{16}$ and $D_1$ to $D_{16}$ is dislocated once again. After the dislocation, $Dout_3$ to $Dout_{16}$ correspond to $D_1$ to $D_{14}$, and $Dout_1$ and $Dout_2$ correspond to $D_{15}$ and $D_{16}$. When the loop filter works in the mode 2 and when SEL=3, because only $Dout_8$ in $Dout_1$ to $Dout_{16}$ flips from 0 to 1 or from 1 to 0 (values of $Dout_1$ to $Dout_7$ are 1, and values of $Dout_9$ to $Dout_{16}$ are 0), after $D_1$ to $D_{16}$ pass through a MUX circuit, only $D_6$ in $D_1$ to $D_{16}$ flips from 0 to 1 or from 1 to 0 (values of $D_{15}$, $D_{16}$, and $D_1$ to $D_5$ are 1, and values of $D_7$ to $D_{14}$ are 0). An amplitude of $Icell_6$ can be measured through a digital fixed-point DFT circuit.

When SEL=3, the MUX selects $Icell_6$ to receive a measured digit flipping between 0 and 1, an amplitude value measured by the fixed-DFT circuit is an amplitude value of $Icell_6$, and the amplitude value of $Icell_6$ is an amplitude value obtained after the loop filter and the quantizer convert an analog output of $Icell_6$ into a digital signal and the digital filter filters out a high-frequency part of the digital signal.

By analog, when SEL=4, the MUX selects $Icell_5$ to receive a measured digit flipping between 0 and 1, and an amplitude value measured by the fixed-DFT circuit is an amplitude value of $Icell_5$.

When SEL=5, the MUX selects $Icell_4$ to receive a measured digit flipping between 0 and 1, and an amplitude value measured by the fixed-DFT circuit is an amplitude value of $Icell_4$.

When SEL=6, the MUX selects $Icell_3$ to receive a measured digit flipping between 0 and 1, and an amplitude value measured by the fixed-DFT circuit is an amplitude value of $Icell_3$.

When SEL=7, the MUX selects $Icell_2$ to receive a measured digit flipping between 0 and 1, and an amplitude value measured by the fixed-DFT circuit is an amplitude value of $Icell_2$.

When SEL=8, the MUX selects $Icell_1$ to receive a measured digit flipping between 0 and 1, and an amplitude value measured by the fixed-DFT circuit is an amplitude value of $Icell_1$.

When SEL=9, the MUX selects $Icell_{16}$ to receive a measured digit flipping between 0 and 1, and an amplitude value measured by the fixed-DFT circuit is an amplitude value of $Icell_{16}$.

When SEL=10, the MUX selects $Icell_{15}$ to receive a measured digit flipping between 0 and 1, and an amplitude value measured by the fixed-DFT circuit is an amplitude value of $Icell_{15}$.

When SEL=11, the MUX selects $Icell_{14}$ to receive a measured digit flipping between 0 and 1, and an amplitude value measured by the fixed-DFT circuit is an amplitude value of $Icell_{14}$.

When SEL=12, the MUX selects $Icell_{13}$ to receive a measured digit flipping between 0 and 1, and an amplitude value measured by the fixed-DFT circuit is an amplitude value of $Icell_{13}$.

When SEL=13, the MUX selects $Icell_{12}$ to receive a measured digit flipping between 0 and 1, and an amplitude value measured by the fixed-DFT circuit is an amplitude value of $Icell_{12}$.

When SEL=14, the MUX selects $Icell_{11}$ to receive a measured digit flipping between 0 and 1, and an amplitude value measured by the fixed-DFT circuit is an amplitude value of $Icell_{11}$.

When SEL=15, the MUX selects $Icell_{10}$ to receive a measured digit flipping between 0 and 1, and an amplitude value measured by the fixed-DFT circuit is an amplitude value of $Icell_{10}$.

Figure 10D:
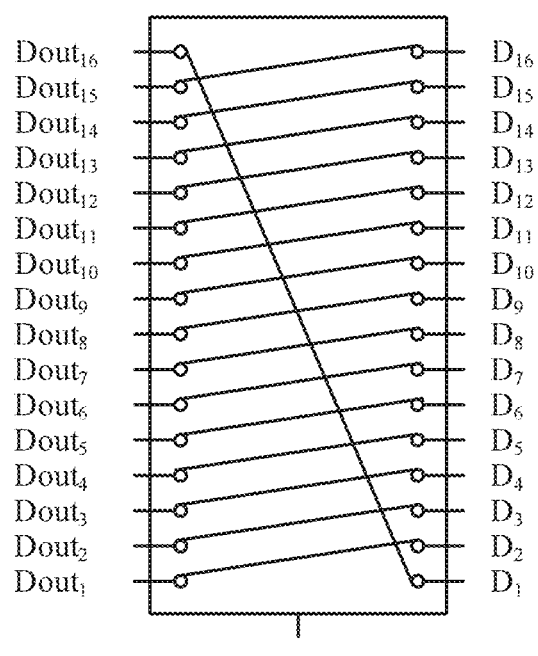
FIG. 10D shows a conducted electric connection relationship between P source cells and P digits output by a quantizer when SEL=16 according to an embodiment of this application.

FIG. 10D shows a connected state of a connection terminal inside a multiplexer switch MUX when the MUX receives SEL=16. A conducted relationship between $Dout_1$ to $Dout_{16}$ and $D_1$ to $D_{16}$ is dislocated once again. After the dislocation, $Dout_1$ to $Dout_{15}$ correspond to $D_2$ to $D_{16}$, and $Dout_{16}$ corresponds to $D_1$. When the loop filter works in the mode 2 and when SEL=16, because only $Dout_8$ in $Dout_1$ to $Dout_{16}$ flips from 0 to 1 or from 1 to 0 (values of $Dout_1$ to $Dout_7$ are 1, and values of $Dout_9$ to $Dout_{16}$ are 0), after $D_1$ to $D_{16}$ pass through a MUX circuit, only $D_9$ in $D_1$ to $D_{16}$ flips from 0 to 1 or from 1 to 0 (values of $D_2$ to $D_8$ are 1, and values of $D_1$ and $D_{10}$ to $D_{16}$ are 0). An amplitude of Icell$_9$ can be measured through a digital fixed-point DFT circuit.

In one embodiment, the apparatus is presented in a form of obtaining the function modules through division according to the corresponding functions. Alternatively, the apparatus is presented in a form of obtaining the function modules through division in an integrated manner. The "module" herein may be an application-specific integrated circuit (ASIC), a circuit, a processor and a memory for executing one or more software or firmware programs, an integrated logic circuit, and/or another device that can provide the foregoing function.

In conclusion, based on the feedback DAC error measurement apparatus provided in this application, an out-of-band gain ($H_{inf}$) can be reduced using a method for reducing the power-on order quantity of the loop filter or adjusting the element coefficient of the loop filter, to avoid that an output flipping code value exceeds 2. In this case, there are two statuses of 16 digits output by $D_{out}$. Correspondingly, only one of the 16 digits output by $D_{out}$ flips between 0 and 1. In this way, a matching error of each source cell is not introduced when another source cell is measured. Therefore, measurement accuracy of a matching error of a source cell is improved. In addition, in implementation, a MUX switch is used. Each time measurement is performed, one source cell is separately selected from P source cells to receive one flipping digit, to implement selection of the source cell that separately receives the flipping digit.

Figure 11:
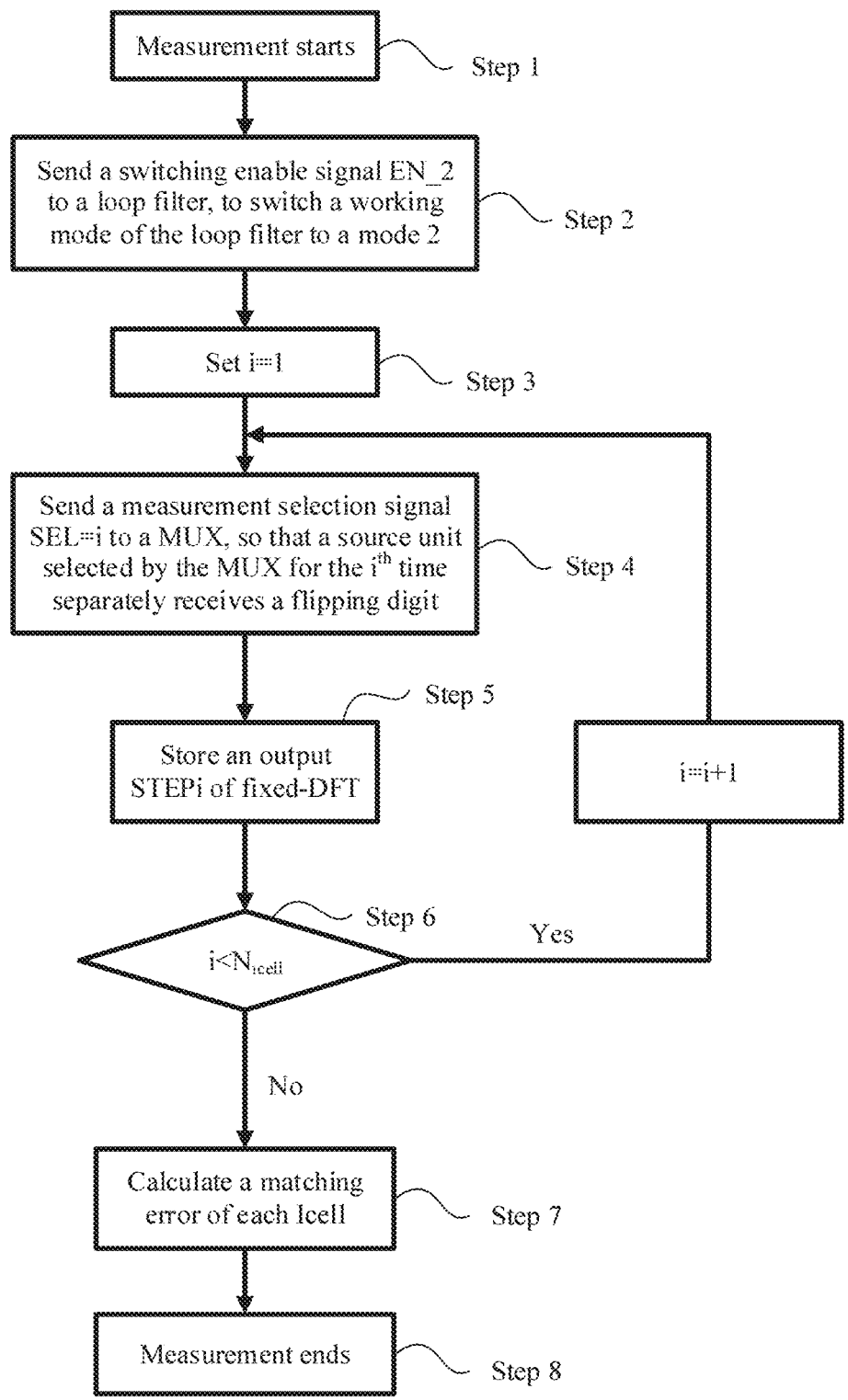
FIG. 11 is a schematic method flowchart of a DAC error measurement method according to an embodiment of this application.

Based on the descriptions of the feedback DAC matching error measurement apparatus in the foregoing embodiment, the following shows a procedure of a feedback DAC matching error measurement method. As shown in FIG. 11, the method mainly includes the following steps.

Step 1: Start a measurement procedure based on a start signal. The start signal may be generated based on a power-on signal, or may be controlled by software of a product. A function of the start signal includes powering on a signal source $I_{Test}$ and a signal source $I_{DC}$, to use a square wave signal and a direct-current signal as a measurement input of an ADC.

Step 2: Send a switching enable signal EN_2 (when it is necessary to switch to a mode 1, the sent switching enable signal may be EN_1) to a loop filter, and switch a working mode of the loop filter to a mode 2.

Step 3: Set i=1, to be more specific, start to measure, based on a default conducted relationship between P source cells and P digits, Icell that is conducted by default with a flipping digit.

Step 4: When $i^{th}$ measurement is performed, send a measurement selection signal SEL=i to a MUX.

The MUX agrees on the conducted electric connection relationship between the P source cells and the P digits when SEL=1 by default, and sends a measurement selection signal SEL=i to the MUX when the $i^{th}$ measurement is performed, such that the MUX dislocates, based on SEL=i, the conducted electric connection relationship between the P source cells and the P digits, a source cell selected for the $i^{th}$ time receives a measured digit flipping between 0 and 1, and an amplitude value measured by a fixed-DFT circuit is an amplitude value STEPi of the source cell selected by the MUX for the $i^{th}$ time.

A source cell selected by the MUX each time is different. When the $i^{th}$ measurement is performed, the source cell selected by the MUX for the $i^{th}$ time may not necessarily be Icell numbered i.

Step 5: Make an error calculation module read an output value of the fixed-DFT circuit, and store the output value as STEP$_i$. STEP$_i$ refers to an amplitude value obtained after the loop filter and a quantizer convert an analog output provided by the source cell selected by the MUX for the $i^{th}$ time into a digital signal and a digital filter filters out a high-frequency part of the digital signal.

Step 6: Determine whether a value of i is less than or equal to a total quantity $N_{Icell}$ of source cells that need to be measured, that is, $N_{Icell}$=P. If the value of i is less than or equal to the total quantity $N_{Icell}$, set i=i+1, and go to step 4; if the value of i is not less than or equal to the total quantity $N_{Icell}$, go to step 7.

Step 7: Calculate errors of all Icells. Detailed calculation steps are as follows.

First, calculate an average amplitude value of all the Icells: $STEP_{average}=1/N_{icell} \cdot \Sigma STEP_i$, where $\Sigma STEP_i$ represents a sum of P measurement results $STEP_1$, $STEP_2$, ..., $STEP_P$, and $1/N_{icell} \cdot \Sigma STEP_i$; represents an average value of the P measurement results.

Then, a matching error of each Icell is calculated: $E_i = (STEP_i - STEP_{average})/STEP_i$. $E_i$ represents a matching error of the source cell selected for measurement for the $i^{th}$ time.

Step 8: End feedback DAC matching error measurement.

It should be noted that the foregoing measurement process may be controlled by a computer application program (software), or may be controlled by the control module shown in FIG. 2A.

According to the DAC error measurement method provided in the foregoing embodiments of this application, the loop filter is reconfigurable. When the loop filter is in the mode 2 due to adjustment of a power-on order quantity or an element coefficient, an input low loop gain provided to the quantizer can implement that one flipping digit in a digital output of the quantizer is a measured digit, and remaining digits are non-flipping digits. Based on this, a measurement selection module may separately select one source cell to receive the measured digit, and provide the remaining digits to remaining source cells. In this way, a matching error of a source cell may not be introduced when a matching error of the separately selected source cell is measured. In addition, the direct-current signal in the measurement input is at a constant logical level, such that matching errors of all source cells are measured under a same bias condition, thereby helping improve measurement accuracy of the matching error.

The foregoing DAC error measurement method and apparatus provided in the embodiments of this application may be applied to a continuous-time DSM and a discrete-time DSM, or may be applied to a differential DSM and a single-ended DSM. The feedback DAC error measurement apparatus and the feedback DAC error measurement method provided in this application may not only be applied to a DSM, but also be applied to another circuit system including a DAC, for example, a pipeling-ADC or a circuit including only a DAC. In both the foregoing cases, the measured matching error value of the DAC in the foregoing embodiment of this application can be used.

In the foregoing DAC error measurement method and apparatus provided in the embodiments of this application, the control module may be electrically connected to the loop filter, the MUX, the signal source $I_{Test}$, the signal source $I_{DC}$, the measurement module (the fixed-DFT circuit), and the error calculation module through a circuit element. Before measurement, the control module may control the first signal source $I_{Test}$, the second signal source $I_{DC}$, the fixed-DFT circuit, and the error calculation module to be powered on. In a measurement process, the control module sends the switching enable signal EN to the loop filter to implement mode switching, the control module sends the measurement selection signal SEL to the MUX, to indicate the MUX to select a specific source cell to receive the measured digit. The control may be implemented by specific circuit elements in the control module.

In an optional embodiment, the error calculation module may alternatively be a calculation unit in the control module, and an action performed by the error calculation module may be completed by the calculation unit in the control module.

In an optional embodiment, the control module may be disposed in the feedback DAC error measurement apparatus in the foregoing embodiments, or may be disposed outside the feedback DAC error measurement apparatus.

Figure 12:
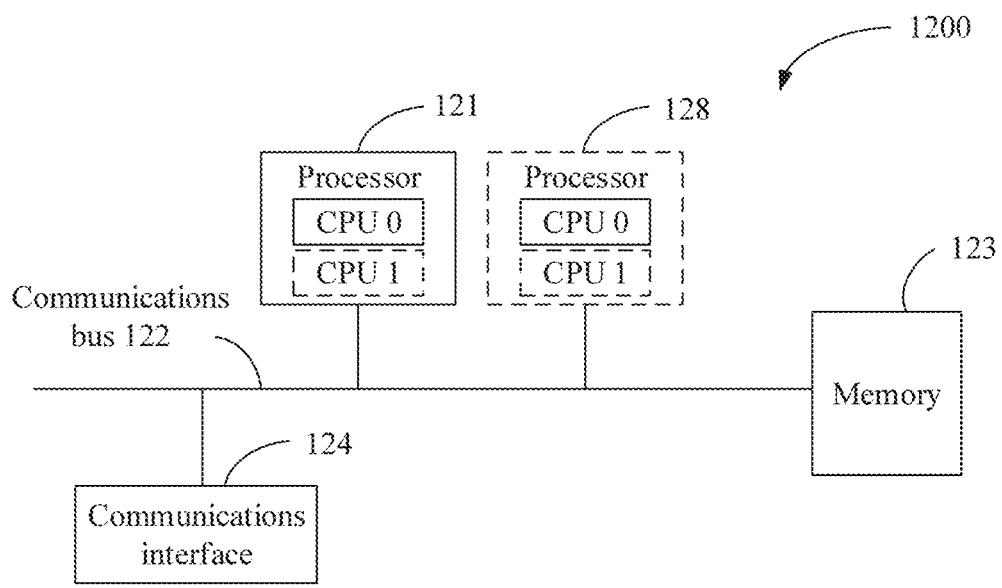
FIG. 12 is a schematic structural diagram of an apparatus according to an embodiment of this application.

Based on a same disclosure concept, FIG. 12 shows an apparatus 1200 provided in an embodiment of this application. The apparatus 1200 includes at least one processor 121, a communications bus 122, a memory 123, and at least one communications interface 124. The apparatus 1200 may be separately the control module in the embodiments of this application, or may be the DAC error measurement apparatus in this application. The processor 120 is configured to perform a function performed by the control module in the embodiments of this application.

In an optional embodiment, the apparatus 1200 may perform a function performed by the error calculation module in the foregoing embodiments.

In an optional embodiment, the apparatus 1200 may be disposed in the feedback DAC error measurement apparatus in the foregoing embodiments, or may be disposed outside the feedback DAC error measurement apparatus.

The processor 121 may be a general-purpose central processing unit (CPU), a microprocessor, an application-specific integrated circuit (ASIC), or one or more integrated circuits for controlling program execution of the solutions in this application.

The communications bus 122 may include a channel for transmitting information between the foregoing components. The communications interface 124 may use any type of apparatus such as a transceiver to communicate with another device or communications network such as the Ethernet, a radio access network (RAN), or a wireless local area network (WLAN).

The memory 123 may be a read-only memory (ROM) or another type of static storage device that can store static information and an instruction, a random access memory (RAM) or another type of dynamic storage device that can store information and an instruction, or may be an electrically erasable programmable read-only memory (EEPROM), a compact disc read-only memory (CD-ROM) or another compact disc storage, an optical disc storage (including a compact disc, a laser disc, an optical disc, a digital versatile disc, a Blu-ray disc, or the like), a magnetic disk storage medium or another magnetic storage device, or any other medium that can be used to carry or store expected program code in a form of an instruction or a data structure and that can be accessed by a computer. However, this is not limited thereto. The memory may exist independently, and is connected to the processor through a bus. Alternatively, the memory may be integrated with the processor.

In implementation, in an embodiment, the processor 121 may include one or more CPUs, such as a CPU 0 and a CPU 1 in FIG. 12.

In implementation, in an embodiment, the apparatus 1200 may include a plurality of processors, for example, the processor 121 and a processor 128 shown in FIG. 12. Each of the processors may be a single-core (single-CPU) processor or a multi-core (multi-CPU) processor. The processor herein may be one or more devices, circuits, and/or processing cores for processing data (for example, a computer program instruction).

The memory 123 is configured to store application program code for executing the solutions of this application, and the processor 121 controls the execution. The processor 121 is configured to execute the application program code stored in the memory 123.

Based on the foregoing embodiments of this application, before performing measurement, the processor needs to switch a working mode of the feedback DAC error measurement apparatus shown in FIG. 2A or FIG. 2B from a mode 1 to a mode 2.

For example, the processor is configured to: power on a first signal source that provides a square wave signal with a constant frequency and a second signal source that provides a direct-current signal at a constant logical level; power on an error calculation module and a measurement module; and ground an analog input U of an ADC.

In a possible design, the processor is configured to send a switching enable signal to a loop filter of the ADC, such that the loop filter switches a power-on order quantity and/or an element coefficient of the loop filter based on the switching enable signal, and switches a working mode of the loop filter from a mode 1 to a mode 2. The working mode of the loop filter is switched from the mode 1 to the mode 2. A function of the above is to make the loop filter provide a low-gain input to the quantizer in the mode 2, and the quantizer convert the low-gain input into P digits in the mode 2 and use the P digits as the digital output, where only one of the P digits is a flipping digit, the flipping digit flips between 0 and 1, and the flipping digit is used as the measured digit.

In a possible design, the processor is further configured such that in a DAC error measurement process, the processor sends a measurement selection signal to a measurement selection module, where the measurement selection signal indicates a separately selected source cell. A function of the above is to: after the measurement selection module receives the measurement selection signal sent by the processor, perform, based on the measurement selection signal, overall dislocation adjustment on a conducted electric connection relationship between the P digits and P source cells, to provide the measured digit to the separately selected source cell, and provide, based on a coupling relationship obtained after dislocation, remaining P−1 digits to P−1 source cells other than the separately selected source cell.

In a possible design, the processor is configured such that in the DAC error measurement process, the processor successively sends P measurement selection signals to the measurement selection module, where separately selected source cells successively indicated by the P measurement selection signals are different from each other. As such, the measurement selection module successively receives the P measurement selection signals, and performs overall dislocation adjustment on the conducted electric connection relationship between the P digits and the P source cells once each time one of the measurement selection signals is received, until the P source cells are all measured.

In a possible design, the processor is further configured to: after the P source cells of the DAC are measured, obtain, from the measurement module, amplitudes measured by the measurement module when the P source cells are measured; determine an average amplitude value of the P source cells based on the obtained amplitudes; and determine a matching error of each of the P source cells based on the average amplitude value.

It should be noted that after the processor of the apparatus 1200 switches the feedback DAC error measurement apparatus in this embodiment of this application to the mode 2, the DAC error measurement apparatus shown in FIG. 2A, FIG. 2B, FIG. 4B, or FIG. 7B starts error measurement, a process that includes: generating, by an ADC, a digital output based on a measurement input; providing the digital output to a measurement selection module and a measurement module, where the measurement input includes a square wave signal with a constant frequency, a direct-current signal at a constant logical level, and an analog output of a feedback DAC of the ADC; providing, by the measurement selection module, an input to the feedback DAC based on the digital output, where a separately selected source cell is determined, a measured digit in the digital output is provided to the separately selected source cell, and remaining digits in the digital output are provided to remaining source cells, where the measured digit is a flippable digit, and the remaining digits are non-flipping digits; providing, by the feedback DAC, the analog output to the ADC based on the input provided by the measurement selection module; and measuring, by the measurement module, an amplitude of the digital output based on the digital output.

The ADC includes an m-order loop filter and an n-bit quantizer, and an output of the loop filter is coupled to an input of the quantizer. The generating, by an ADC, a digital output based on a measurement input includes: providing, by the loop filter, a low-gain input to the quantizer; and converting, by the quantizer, the low-gain input into P digits and using the P digits as the digital output, where only one of the P digits is a flipping digit, and the flipping digit flips between 0 and 1, and the flipping digit is used as the measured digit.

The digital output is a thermometer code, and the P digits include $2^n$ digits; or the digital output is a binary code, and the P digits include n digits.

The feedback DAC includes P source cells, and the measurement selection module provides a digital input to the P source cells based on the received P digits.

In a possible design, the providing, by the measurement selection module, an input to the feedback DAC based on the digital output includes: receiving, by the measurement selection module, the measurement selection signal sent by the control module; and performing, based on the measurement selection signal, overall dislocation adjustment on a conducted electric connection relationship between the P digits and the P source cells, to provide the measured digit to the separately selected source cell, and provide, based on a coupling relationship obtained after dislocation, remaining P−1 digits to P−1 source cells other than the separately selected source cell.

In a possible design, the providing, by the measurement selection module, an input to the feedback DAC based on the digital output includes: successively receiving, by the measurement selection module, P measurement selection signals provided by the control module, where separately selected source cells successively indicated by the P measurement selection signals are different from each other; and performing overall dislocation adjustment on the conducted electric connection relationship between the P digits and the P source cells once each time the measurement selection module receives one of the measurement selection signals, until the P source cells are all measured.

In a possible design, the measuring, by the measurement module, an amplitude of the digital output based on the digital output includes: receiving, by the measurement circuit, a digital output from which a high-frequency part is filtered out; and measuring an amplitude of the digital output from which the high-frequency part is filtered out, where an output of the quantizer is coupled to an input of the digital filter circuit, an output of the digital filter circuit is coupled to an input of the measurement circuit, and the digital filter circuit provides, to the measurement circuit, the digital output from which the high-frequency part is filtered out.

In a possible design, if the feedback DAC error measurement apparatus further includes an error calculation module, the error calculation module is configured to: obtain, from the measurement module, the amplitudes measured by the measurement module when the P source cells are measured; determine an average amplitude value of the P source cells based on the obtained amplitudes; and determine a matching error of each of the P source cells based on the average amplitude value.

According to the DAC error measurement method provided in the foregoing embodiments of this application, the loop filter is reconfigurable. When the loop filter is in the mode 2 due to adjustment of a power-on order quantity or an element coefficient, an input low loop gain provided to the quantizer can implement that one flipping digit in a digital output of the quantizer is a measured digit, and remaining digits are non-flipping digits. Based on this, a measurement selection module may separately select one source cell to receive the measured digit, and provide the remaining digits to remaining source cells. In this way, a matching error of a source cell may not be introduced when a matching error of the separately selected source cell is measured. In addition, the direct-current signal in the measurement input is at a constant logical level, such that matching errors of all source cells are measured under a same bias condition, thereby helping improve measurement accuracy of the matching error.

Division into function modules may be performed on the foregoing apparatus based on the foregoing examples in the embodiments of this application. For example, the function modules may be obtained through division according to the corresponding functions, or two or more functions may be integrated into one processing module. The integrated module may be implemented in a form of hardware, or may be implemented in a form of a software function module. It should be noted that, in the embodiments of this application, division into modules is an example, and is merely a logical function division. In an actual implementation, another division manner may be used.

Figure 13:
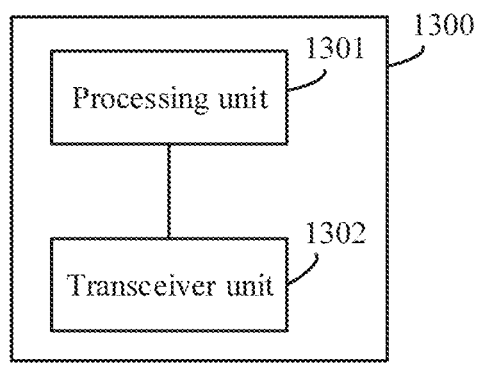
FIG. 13 is a schematic structural diagram of another apparatus according to an embodiment of this application.

For example, when the function modules are obtained through division according to the corresponding functions, FIG. 13 is a possible schematic structural diagram of the apparatus 1300 in the foregoing embodiment. The apparatus 1300 includes a processing unit 1301 and a transceiver unit 1302. The transceiver unit 1302 is used by the processing unit 1301 to send and receive a signal. The apparatus may be the apparatus 1200 in the foregoing embodiment.

In a possible design, the transceiver 1302 is configured to send a switching enable signal to the loop filter according to the first aspect or the second aspect, to switch a working mode of the loop filter from a mode 1 to a mode 2. The switching enable signal is used to switch a power-on order quantity and/or an element coefficient of the loop filter, and a function of the above is to make the loop filter provide a low-gain input to the quantizer in the mode 2, and the quantizer convert the low-gain input into P digits in the mode 2 and use the P digits as the digital output, to implement that only one of the P digits is a flipping digit, the flipping digit flips between 0 and 1, and the flipping digit is used as the measured digit.

In a possible design, the transceiver unit 1302 is further configured such that in a measurement process of the P source cells according to the first aspect or the second aspect, the transceiver unit 1302 sends a measurement selection signal to a measurement selection module, where the measurement selection signal indicates a separately selected source cell. A function of the above is to: after the measurement selection module according to the first aspect or the second aspect receives the measurement selection signal sent by the control module, perform, based on an indication of the measurement selection signal, overall dislocation adjustment on a conducted electric connection relationship between the P digits and the P source cells, to provide the measured digit to the separately selected source cell, and provide, based on a coupling relationship obtained after dislocation, remaining P−1 digits to P−1 source cells other than the separately selected source cell.

In a possible design, the transceiver unit 1302 is configured such that in the measurement process of the P source cells according to the first aspect or the second aspect, the transceiver unit 1302 successively sends P measurement selection signals to the measurement selection module, where separately selected source cells successively indicated by the P measurement selection signals are different from each other. A function of the above is to: make the measurement selection module to successively receive the P measurement selection signals; and perform overall dislocation adjustment on the conducted electric connection relationship between the P digits and the P source cells once each time the measurement selection module receives one of the measurement selection signals, until the P source cells are all measured.

In a possible design, the processing unit 1301 may perform a calculation function performed by the error calculation module according to the first aspect or the second aspect.

For example, the processing unit 1301 is further configured to: obtain, from a measurement module, amplitudes measured by the measurement module when the P source cells are measured; determine an average amplitude value of the P source cells based on the obtained amplitudes; and determine a matching error of each of the P source cells based on the average amplitude value. The control module according to the first aspect or the second aspect can perform the calculation function performed by the error calculation module according to the first aspect or the second aspect. This helps simplify a circuit.

In a possible design, the processing unit 1301 is configured to switch a working mode of the DAC error measurement apparatus according to the first aspect from a mode 1 to a mode 2 before sending the switching enable signal to the loop filter.

For example, the processing unit 1301 is further configured to: power on the measurement module, the measurement selection module, a first signal source, and a second signal source before sending the switching enable signal to the loop filter, where the first signal source provides a square wave signal with a constant frequency to the loop filter, and the second signal source provides a direct-current signal at a constant logical level to the loop filter; and ground an analog input U of the ADC. A function of the above is to make a measurement input provided by an input end of the ADC include the square wave signal with the constant frequency provided by the first signal source, the direct-current signal at the constant logical level provided by the second signal source, and an analog output of a feedback DAC.

In a simple embodiment, the processing unit 1301 of the apparatus 1300 may be implemented by a processor, and the transceiver unit 1302 may be implemented by a transceiver. For example, a method performed by the processing unit 1301 may be performed by the processor by invoking application program code stored in a memory. This is not limited in the embodiments of this application.

An embodiment of this application further provides a communications apparatus. The communications apparatus includes a processor and a memory. The memory stores a computer program. When the processor reads and executes a computer program stored in the memory, the communications apparatus is enabled to implement a method performed by the control module in the foregoing embodiments of this application.

An embodiment of this application further provides a chip, where the chip is connected to a memory, the memory stores a computer program. The chip is configured to read and execute the computer program stored in the memory, to implement a method performed by the control module in the foregoing embodiments of this application.

An embodiment of this application further provides a computer storage medium storing program code. The stored program code is executed by a processor, to implement a method performed by the control module in the foregoing embodiments of this application.

An embodiment of this application further provides a computer program product. The computer program product includes a computer software instruction, and the computer software instruction may be loaded by a processor to implement a method performed by the control module in the foregoing embodiments of this application.

Mutual reference may be made between descriptions of the embodiments provided in the present disclosure. For ease and brevity of description, for functions of apparatuses provided in the embodiments of the present disclosure and steps that are performed in the embodiments of the present disclosure, refer to related descriptions in the method embodiments of the present disclosure for mutual reference. Details are not described herein again.

Although this application is described with reference to the embodiments, in a process of implementing this application that claims protection, a person skilled in the art may understand and implement another variation of the disclosed embodiments by viewing the accompanying drawings, disclosed content, and the appended claims. In the claims, "comprising" does not exclude another component or another step, and "a" or "one" does not exclude a meaning of plurality. A single processor or another unit may implement several functions listed in the claims. Some measures are recorded in dependent claims that are different from each other, but this does not mean that these measures cannot be combined to produce a better effect.

It should be understood that the embodiments of this application may be provided as a method, an apparatus (device), or a computer program product. Therefore, this application may use a form of hardware only embodiments, software only embodiments, or embodiments with a combination of software and hardware. They are collectively referred to as "modules" or "systems". Moreover, this application may use a form of a computer program product that is implemented on one or more computer-usable storage media (including but not limited to a magnetic disk memory, a CD-ROM, an optical memory, and the like) that include computer-usable program code. A computer program is stored/distributed in a proper medium and is provided as or used as a part of hardware together with other hardware, or may be distributed in another form, for example, through the Internet or another wired or wireless telecommunications system.

This application is described with reference to the flowcharts and/or block diagrams of the methods, the apparatuses (devices), and the computer program products according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided to a general-purpose computer, a dedicated computer, an embedded processor, or a processor of another programmable data processing device to generate a machine, such that the instructions executed by a computer or the processor of the other programmable data processing device generate an apparatus for implementing a specific function in one or more processes in the flowcharts and/or in one or more blocks in the block diagrams.

These computer program instructions may also be stored in a computer-readable memory that can instruct the computer or another programmable data processing device to work in a specific manner, such that the instructions stored in the computer-readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the other programmable device, thereby generating computer-implemented processing. Therefore, the instructions executed on the computer or the other programmable device provide steps for implementing a specific function in one or more processes in the flowcharts and/or in one or more blocks in the block diagrams.

Although this application is described with reference to features and the embodiments thereof, various modifications and combinations may be made to this application without departing from the spirit and scope of this application. Correspondingly, this specification and the accompanying drawings are merely examples for description of this application defined by the appended claims, and are considered as any or all of modifications, variations, combinations, or equivalents that cover the scope of this application. A person skilled in the art may make various modifications and variations to this application without departing from the spirit and scope of this application. This application is intended to cover these modifications and variations of this application provided that they fall within the scope of the following claims and their equivalent technologies.

What is claimed is:

1. A digital-to-analog converter (DAC) error measurement apparatus, comprising:
   an analog-to-digital converter (ADC) configured to digitize a measurement input of the ADC to generate a digital output and use the digital output as an input, wherein the ADC comprises a feedback DAC, and wherein the measurement input comprises a square wave signal with a constant frequency, a direct-current signal at a constant logical level, and an analog output of the feedback DAC, which is configured to provide the analog output to the ADC based on a second input;
   a measurement selection module configured to:
      receive the digital output as the input; and
      provide the second input to the feedback DAC based on the digital output, wherein the measurement selection module is further configured to provide a measured digit in the digital output to a separately selected source cell and provide remaining digits in the digital output to remaining source cells, wherein the measured digit is a flippable digit, and wherein the remaining digits are non-flipping digits; and
   a measurement module configured to measure an amplitude of the digital output based on the digital output.

2. The apparatus according to claim 1, wherein the ADC further comprises a loop filter and a quantizer, wherein an output of the loop filter is coupled to an input of the quantizer, wherein the loop filter is configured to provide a low-gain input to the quantizer, wherein the quantizer is configured to convert the low-gain input into P digits and uses the P digits as the digital output, wherein only one of the P digits is a flipping digit, wherein the flipping digit flips between 0 and 1, and wherein the flipping digit is the measured digit.

3. The apparatus according to claim 2, wherein the apparatus further comprises a control module configured to provide a switching enable signal to the ADC, and wherein the switching enable signal is configured to control the loop filter to provide the low-gain input to the quantizer.

4. The apparatus according to claim 2, wherein a bit quantity of the quantizer is n, wherein the digital output is a thermometer code, and wherein the P digits comprise $2^n$ digits.

5. The apparatus according to claim 3, wherein the feedback DAC comprises P source cells, wherein the control module is further configured to provide a measurement selection signal to the measurement selection module, wherein the measurement selection signal indicates the separately selected source cell, and wherein the measurement selection module is further configured to:
   perform, based on the measurement selection signal, overall dislocation adjustment on a conducted electric connection relationship between the P digits and the P source cells to provide the measured digit to the separately selected source cell; and
   provide, based on another conducted electric connection relationship obtained after dislocation, remaining P-1 digits to P-1 source cells other than the separately selected source cell.

6. The apparatus according to claim 5, wherein the control module is further configured to successively provide P measurement selection signals to the measurement selection module.

7. The apparatus according to claim 2, further comprising a digital filter circuit having an input coupled to an output of the quantizer and an output coupled to an input of the measurement module, wherein the digital filter circuit is configured to filter out a high-frequency part from the digital output and provide, to the measurement module, a digital output from which the high-frequency part is filtered out, and wherein the measurement module is further configured to measure an amplitude of the digital output from which the high-frequency part is filtered out.

8. The apparatus according to claim 7, wherein the apparatus further comprises an error calculation module connected to the measurement module.

9. An apparatus applied to signal control of a digital-to-analog converter (DAC) error measurement apparatus including a quantizer and a loop filter, wherein the apparatus comprises:
- a processor; and
- a memory coupled to the processor and configured to store an instruction executable by the processor such that when executed, the apparatus is configured to:
  - send a switching enable signal to the loop filter, wherein the switching enable signal is configured to switch a power-on order quantity and/or an element coefficient of the loop filter to cause the loop filter to provide a low-gain input to the quantizer; and
  - send a measurement selection signal to a measurement selection module, wherein the measurement selection signal indicates a separately selected source cell.

10. The apparatus according to claim 9, wherein the apparatus is further configured to successively send P measurement selection signals to the measurement selection module.

11. The apparatus according to claim 10, wherein separately selected source cells successively indicated by the P measurement selection signals are different from each other.

12. The apparatus according to claim 11, wherein the apparatus is further configured to:
- obtain, from a measurement module of the DAC error measurement apparatus, the amplitudes measured by the measurement module when P source cells are measured;
- determine an average amplitude value of the P source cells based on the amplitudes; and
- determine a matching error of each of the P source cells based on the average amplitude value.

13. The apparatus according to claim 12, wherein the apparatus is further configured to power on the measurement module, a first signal source, and a second signal source before sending the switching enable signal to the loop filter.

14. The apparatus according to claim 13, wherein the first signal source is configured to provide a square wave signal with a constant frequency to the loop filter.

15. The apparatus according to claim 14, wherein the second signal source is configured to provide a direct-current signal at a constant logical level to the loop filter.

16. The apparatus according to claim 3, wherein the ADC is further configured to switch a power-on order quantity or an element coefficient of the loop filter based on the switching enable signal provided by the control module to cause the loop filter to provide the low-gain input to the quantizer.

17. The apparatus according to claim 2, wherein the digital output is a binary code, and wherein the P digits comprise n digits.

18. The apparatus according to claim 6, wherein separately selected source cells indicated by the P measurement selection signals are different from each other.

19. The apparatus according to claim 18, wherein the measurement selection module is further configured to:
- receive the P measurement selection signals successively provided by the control module; and
- perform overall dislocation adjustment on the conducted electric connection relationship between the P digits and the P source cells once each time one of the measurement selection signals is received and until the P source cells are separately selected in turn to receive the measured digit.

20. The apparatus according to claim 8, wherein the error calculation module is configured to:
- obtain, from the measurement module, amplitudes measured by the measurement module when the P source cells are measured;
- determine an average amplitude value of the P source cells based on the amplitudes; and
- determine a matching error of each of the P source cells based on the average amplitude value.

* * * * *